United States Patent
Nagashima

(10) Patent No.: US 7,769,064 B2
(45) Date of Patent: Aug. 3, 2010

(54) LASER DIODE CONTROL METHOD, LASER DIODE CONTROL DEVICE, AND INFORMATION RECORDING/PLAYBACK APPARATUS

(75) Inventor: Kenichi Nagashima, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 208 days.

(21) Appl. No.: 12/164,894

(22) Filed: Jun. 30, 2008

(65) Prior Publication Data
US 2009/0059978 A1 Mar. 5, 2009

(30) Foreign Application Priority Data
Sep. 3, 2007 (JP) .............................. 2007-227679

(51) Int. Cl.
*H01S 3/04* (2006.01)
(52) U.S. Cl. ......................................... 372/34; 369/120
(58) Field of Classification Search ................. 347/131, 347/19; 369/53.12, 53.18
See application file for complete search history.

(56) References Cited

U.S. PATENT DOCUMENTS

| 5,461,603 | A | * | 10/1995 | Otsuka ..................... 369/53.18 |
| 6,125,093 | A | * | 9/2000 | Toda et al. .................. 369/116 |
| 6,738,330 | B2 | * | 5/2004 | Shumura et al. ......... 369/53.18 |

FOREIGN PATENT DOCUMENTS

| JP | 2000-037906 | 2/2000 |
| JP | 2000-040850 | 2/2000 |
| JP | 2004-171655 | 6/2004 |

\* cited by examiner

*Primary Examiner*—Minsun Harvey
*Assistant Examiner*—Tuan Nguyen
(74) *Attorney, Agent, or Firm*—Townsend and Townsend and Crew LLP

(57) ABSTRACT

Even though a laser diode is within the operation guarantee temperature range, the rise time characteristics required to protect and maintain the writing quality right away may not be present at a lower temperature. By sufficiently increasing the rise time, a laser diode control method of the present invention makes it possible to write readily. A laser diode control device includes a temperature sensor for detecting temperature of a laser diode. When a detected temperature by the temperature sensor is equal to or below a predetermined value within the operation guarantee temperature range, a seek motor controls the position of a pickup to move the pickup to a region outside a recording region of a recording medium. In this way, a current exceeding a threshold current value is supplied to the laser diode, and the writing operation starts after the laser diode temperature is increased up to a level where the rise time characteristics required to protect and maintain the writing quality is present.

16 Claims, 24 Drawing Sheets

LASER DIODE CONTROL METHOD, LASER DIODE CONTROL DEVICE, AND INFORMATION RECORDING/PLAYBACK APPARATUS

BACKGROUND OF THE INVENTION

The present invention relates in general to an information recording and playback apparatus; and, more particularly, to a control method of a laser diode for writing to or reading from an optical disc used in a camcorder.

It has been long since a video camera using an optical disc device as a recording medium was produced. The optical disc device itself is now expanding its application from compact disc (CD) and digital versatile disc (DVD) towards a next generation DVD such as high definition DVD (HD DVD) and Blu-ray disc (BD). The next generation DVD has a recording capacity three to five times greater than traditional DVDs, and recent advances in plasma display panel (PDP) and increasing demand for high definition image has aroused a lot of interest in it as a recording medium to cope with an increase in data rate along with the high definition image.

In the optical disc device, an increase in recording capacity per unit area is one of factors of increasing the recording capacity. To accomplish this, it is necessary to make a laser beam irradiated onto an optical disc to record or read data smaller in diameter. The diameter of laser beam can be reduced simply by using a shorter wavelength of laser beam for writing or reading.

Among laser diode (LD) light sources, a blue-violet laser diode is known to output the light with the shortest wavelength. Examples of products that have an optical disc device using the blue-violet laser diode include PC (Personal Computer), game device, video recorder, and so on. Also, there is a laser beam image forming apparatus that uses a laser diode.

A disadvantage of the above-described optical disc device or an apparatus using the same is that if temperature of a laser diode is lower than ambient temperature, dews are sometimes formed on the output side of the laser diode and energy of the laser beam is converted into heat energy by the waterdrops, possibly breaking a lens. To prevent this, JP-A-2000-040850 or JP-A-2000-037906 suggests that if dew condensation takes place or LD temperature is lower than a preset temperature, a laser beam should not be outputted until dew condensation is eliminated by feeding an offset current equal to or lower than a threshold level.

In addition, JP-A-2004-171655 describes that photographing operation of an optical disc device used for a camcorder can be assured by lowering false detection of dew condensation on a laser diode of the optical disc device.

However, short wavelength LD, e.g., blue-violet LD has a narrower operation guarantee temperature range than LDs of different colors with long wavelengths, and does not operate at a low temperature. Also, a low temperature kink phenomenon or long-term rise in laser beam intensity may occur. The low temperature kink phenomenon is observed when current-laser power linearity breaks down, given that current (horizontal axis) fed to a LD and laser beam output (vertical axis) characteristics are plotted with temperature as a parameter. The long-term rise in laser beam intensity means that it takes a long time to increase a laser beam emitted from an LD to which current had been applied up to a specific intensity level.

These problems rarely occur when camcorders or portable BD players are used indoor, but recording (write) or reading information may not be possible if they are used in cold outdoor areas.

FIG. 1 graphically illustrates a relationship between supply current (or simply current) I and output laser power L (I-L characteristics) when LD temperature is 25° C. The horizontal axis represents current values (unit: [mA]) fed to an LD, and the vertical axis represents laser power (unit: [mW]) of a laser beam output corresponding to the current value being supplied.

In FIG. 1, Ith indicates a threshold current value, and Isc indicates a maximum allowable current. No laser beam is outputted in area A where the current I is smaller than the threshold current value Ith. When the threshold current value exceeds the current Ith, a laser beam is outputted and linearity is maintained meaning that the laser power increases proportionally to the supply current. Later when the supply current reaches the maximum allowable current Isc, current is no longer fed to the LD such that laser beam output is not increased any more (area B).

Temperature characteristics of an LD will now be described with reference to FIG. 2. FIG. 2 graphically illustrates a relationship between supply current I and output laser power L with laser temperatures (0° C., 10° C., and 20° C.) as a parameter.

As shown in FIG. 2, laser power with respect to the supply current is decreased as LD temperature is increased from 0° C. to 10° C. and 20° C. In addition, a threshold current value tends to increase as temperature is increased.

Meanwhile, when LD temperature is at 0° C., linearity disappears in mid course. The phenomenon of losing linearity at a low temperature is called a low-temperature kink. Since linearity is not present at a temperature where the low-temperature kink is observed, the temperature is outside the operation guarantee temperature range. Typically, LD would not operate at temperature outside the operation guarantee temperature range, it is impossible to write (record) to or read (playback) from an optical disc device.

There is another problem that although LD temperature may have been increased to the operation guarantee temperature, the temperature rise time until a laser beam is outputted tends to get longer at lower temperatures.

Because of this, if LD temperature is low, it can be an option to execute a writing or reading operation anyway despite that a target laser power level required for the writing or reading operation is not yet reached. In this case, however, write quality may be impaired or read error ("misread") may occur.

JP-A-2000-040850 and JP-A-2000-037906 as related art technologies concerning a laser diode drive controller provided with a cooler are to prevent an LD from being cooled to extremely low temperatures even if the LD may have become very hot by laser beam output. In particular, JP-A-2000-040850 is about how to eliminate trouble in a laser drive controller caused by dew condensation, and JP-A-2000-037906 discloses a technique for driving a disc within a reference temperature range by feeding current equal to or lower than a threshold value since the temperature control is not possible at a low temperature where a cooler does not operate, thereby changing output of a laser beam.

According to JP-A-2004-171655, dew condensation is observed when an optical disc device built in a camcorder is cooled so that an LD therein itself becomes cooled to a temperature even lower than the ambient temperature, causing moisture in ambient atmosphere stuck to the LD. In other words, when LD temperature is higher than the operation guarantee temperature of the LD, a cooling operation is carried out compulsively. This makes only the LD temperature lower than the ambient temperature such that dew condensation problems are accompanied inevitably. This dew condensation phenomenon of JP-A-2004-171655 is also found in JP-A-2000-040850 concerning the countermeasure of dew condensation and in JP-A-2000-037906 concerning a laser diode drive controller with a cooler.

At any rate, the problems in related art techniques illustrated in JP-A-2000-040850, JP-A-2000-037906, JP-A-2004-171655 is not those that cause the low-temperature kink phenomenon such as LD temperature is lower than the operation guarantee temperature range, or the rise in laser beam intensity becomes longer even if the laser diode temperature falls within the operation guarantee temperature range, which are the problems to be solved by the present invention.

SUMMARY OF THE INVENTION

In view of the foregoing problems mentioned above, the present invention provides a laser diode control method, a laser diode control device, and an information recording/playback apparatus for proper operations of information recording or information playback.

To accomplish the object, a first aspect of the present invention provides a laser diode control method used for a laser diode control device including:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, if temperature detected by the temperature sensor is equal to or below a predetermined value, the controller controls the pickup moving means to move the pickup outside a recording region of a recording medium; and the controller controls the drive device to supply a current exceeding a threshold value to the laser diode, thereby outputting a laser beam and increasing temperature of the laser diode.

Another aspect of the present invention provides a laser diode control method used for a laser diode control device including:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, if temperature detected by the temperature sensor is equal to or below a predetermined value, the controller controls the objective lens moving means to move a focus position of a laser beam being radiated to a recording medium to a position outside a recording layer of the recording medium; and the controller controls the drive device to supply a current exceeding a threshold value to the laser diode, thereby outputting a laser beam and increasing temperature of the laser diode.

Yet another aspect of the present invention provides a laser diode control method used for a laser diode control device including:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, if temperature detected by the temperature sensor is equal to or below a predetermined value and if a pickup radiating position is located within a recording region on a recording medium, the controller controls the objective lens moving means to set a focus position of a laser beam being radiated to the recording medium to a position outside a recording layer of the recording medium; the controller controls the pickup moving means to move the pickup outside the recording region of the recording medium; and the controller controls the drive device to supply a current exceeding a threshold value to the laser diode, thereby outputting a laser beam and increasing temperature of the laser diode.

Yet another aspect of the present invention provides a laser diode control method used for a laser diode control device including:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, if temperature detected by the temperature sensor is equal to or below a predetermined value and if a pickup radiating position is located within a recording region on a recording medium, the controller controls the drive device to supply a current equal to or below a threshold value to the laser diode, thereby not outputting a laser beam and increasing temperature of the laser diode while controlling the pickup moving means to move the pickup outside the recording region of the recording medium.

Preferably, if the pickup is moved to a position outside the recording region of the recording medium, the controller controls the objective lens moving means to set a focus position of a laser beam being radiated to the recording medium to a position on an extension line of a recording layer of the recording medium, and the controller controls the drive device to supply a current exceeding a threshold value to the laser diode, thereby outputting a laser beam and increasing temperature of the laser diode.

Another aspect of the present invention provides a laser diode control device includes:

a laser diode;

a drive device for supplying a current to the laser diode to drive the same;

a temperature sensor for detecting temperature around the laser diode;

a pickup having a laser diode, an optical part such as an objective lens, and a case for accommodating the elements;

objective lens moving means for changing a focus position of the objective lens;

pickup moving means for moving the pickup to a predetermined radiating position; and a controller for controlling the objective lens moving means to set a focus position of a laser beam to a position outside a recording layer of a recording medium and/or controlling the pickup moving means to move the pickup outside the recording region of the recording medium, if temperature detected by the temperature sensor is equal to or below a predetermined value, and for controlling the drive device to supply a current exceeding a threshold value to the laser diode.

An aspect of the present invention provides an information recording/playback device including an optical disc device for recording or playing back, under control of a laser diode control device, at least one of video and audio onto or from a recording medium, the device including:

a laser diode;

a drive device for supplying a current to the laser diode to drive the same;

a pickup having a laser diode, an optical part such as an objective lens, and a case for accommodating the elements;

pickup moving means for moving the pickup to a predetermined radiating position;

a temperature sensor for detecting temperature around the laser diode; and a controller, and wherein, under control of the controller, if temperature detected by the temperature sensor is equal to or below a predetermined value, the laser diode control device controls the pickup moving means to move the pickup moving means to a position outside a recording region of a recording medium, the laser diode control device controls the drive device to supply a current exceeding a threshold value to the laser diode, the laser diode control device increases temperature of the laser diode to temperature that allows writing or reading by outputting a laser beam from the laser diode, the laser diode control device controls the pickup moving means to move the pickup to a predetermined recording position of the recording medium if temperature detected by the temperature sensor exceeds a predetermined value, and the laser diode control device records data to or reads data from the recording medium.

Another aspect of the present invention provides an information recording/playback device including an optical disc device for recording or playing back, under control of a laser diode control device, at least one of video or audio onto or from a recording medium, the device including:

a laser diode;

a drive device for supplying a current to the laser diode to drive the same;

a pickup having a laser diode, an optical part such as an objective lens, and a case for accommodating the elements;

pickup moving means for moving the pickup to a predetermined radiating position;

objective lens moving means for changing a focus position of the objective lens, a temperature sensor for detecting temperature around the laser diode; and a controller, wherein, under control of the controller, if temperature detected by the temperature sensor is equal to or below a predetermined value and if a pickup radiating position is located within a recording region on a recording medium, the laser diode control device controls the objective lens moving means to set a focus position of a laser beam being radiated to the recording medium to a position outside a recording layer of the recording medium the laser diode control device controls the drive device to supply a current exceeding a threshold value to the laser diode, thereby outputting a laser beam from the laser diode to increase the temperature of the laser diode, if temperature detected by the temperature sensor exceeds a predetermined value, the pickup moving means the laser diode control device controls the pickup moving means to move the pickup to a predetermined recording position of the recording medium, and the laser diode control device records data to or reads data from the recording medium.

Yet another aspect of the present invention provides an information recording/playback device including an optical disc device for recording or playing back, under control of a laser diode control device, at least one of video or audio onto or from a recording medium, wherein the device includes:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, under control of the controller, if temperature detected by the temperature sensor is equal to or below a predetermined value and if a pickup radiating position is located within a recording region on a recording medium, the laser diode control device controls the objective lens moving means to set a focus position of a laser beam being radiated to the recording medium to a position outside a recording layer of the recording medium the laser diode control device controls the pickup moving means to move the pickup outside a recording region of the recording medium, and the laser diode control device controls the drive device to supply a current exceeding a threshold value to the laser diode, thereby outputting a laser beam.

Another aspect of the present invention provides an information recording/playback device including an optical disc device for recording or playing back, under control of a laser diode control device, at least one of video and audio onto or from a recording medium, the device including:

a laser diode;

a drive device for supplying a current to the laser diode to drive the same;

a pickup having a laser diode, an optical part such as an objective lens, and a case for accommodating the elements;

objective lens moving means for changing a focus position of the objective lens;

pickup moving means for moving the pickup to a predetermined radiating position;

a temperature sensor for detecting temperature around the laser diode; and a controller, wherein, under control of the controller, if temperature detected by the temperature sensor is equal to or below a predetermined value and if a pickup radiating position is located within a recording region on a recording medium, the laser diode control device controls the drive device to supply a current equal to or below a threshold value to the laser diode, thereby not outputting a laser beam while controlling the pickup moving means to move the pickup outside a recording region of the recording medium.

Preferably, if the pickup is moved to a position outside the recording region of the recording medium, the laser diode control device additionally controls the objective lens moving means to set a focus position of a laser beam being radiated to the recording medium to a position on an extension line of a recording layer of the recording medium, and the laser diode control device controls the drive device to supply a current exceeding a threshold value to the laser diode, thereby outputting a laser beam from the laser diode and increasing temperature of the laser diode.

Preferably, the information recording/playback device further includes a semiconductor memory and/or a hard disc device, wherein, if temperature detected by the temperature sensor is equal to or below a predetermined value, the laser diode control device does not record audio and/or video onto the recording medium, but records audio and/or video onto the semiconductor memory and/or the hard disc device.

Preferably, the information recording/playback device further includes a semiconductor memory and/or a hard disc device, wherein, if temperature detected by the temperature sensor is equal to or below a predetermined value, the laser diode control device compares spinup time of the hard disc device with preheating time of the laser diode, if the spinup time of the hard disc device is shorter than the preheating time of the laser diode, the laser diode control device starts spinup of the hard disc device and does not record audio and/or video on the recording medium until preheating processing of the laser diode ends, but records audio and/or video onto the semiconductor memory and/or the hard disc device, if the preheating time of the laser diode is shorter than the spinup time of the hard disc device, the laser diode control device starts the preheating processing on the laser diode but does not perform spinup of the hard disc device, and the laser diode control device records audio and/video on the recording medium after the preheating processing of the laser diode ends.

With the laser diode control method and device of the present invention, information can be recorded to or read from a laser diode in proper manner, and such laser diode control device may advantageously be incorporated into the information recording/playback apparatus.

DESCRIPTION OF SPECIFIC EMBODIMENTS

Figure 3:
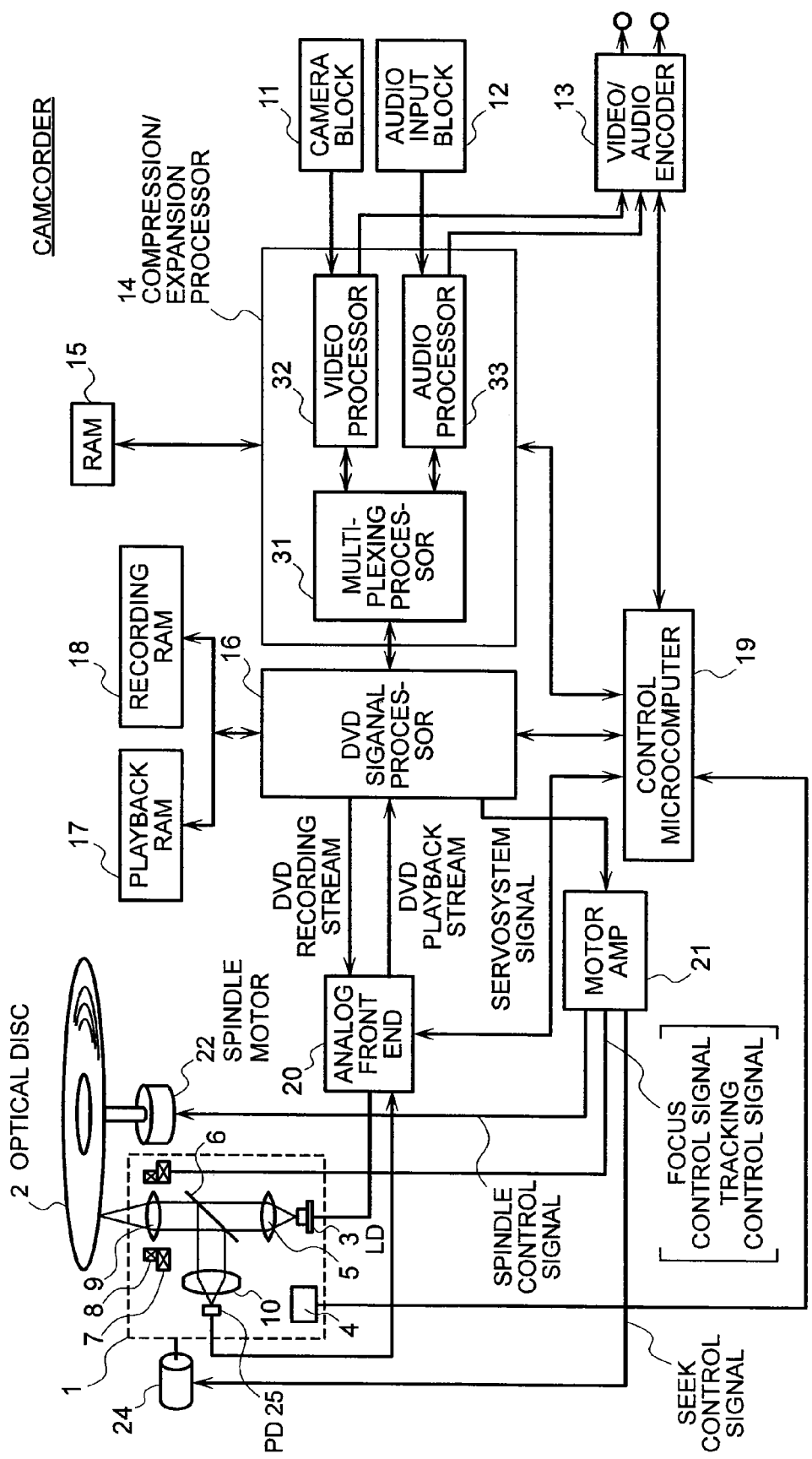
FIG. 3 is a block diagram illustrating the schematic configuration of a camcorder according to one embodiment of the present invention.

FIG. 3 is a block diagram illustrating the schematic configuration of a camcorder according to one embodiment of the present invention. The camcorder includes an optical (pickup) head 1, an optical disc 2, a laser diode (LD) 3, a temperature sensor 4, a collimating lens 5, a beam splitter 6, a tracking actuator 7, a focus actuator 8, an objective lens 9, a condenser lens 10, a photodiode (PD) to convert light from the objective lens 10 into an electrical signal, a camera block 11, an audio input block 12, a video/audio encoder 13, a compression/expansion processing block 14, a random access memory (RAM) 15, a DVD signal processor 16, a playback RAM 17, a recording RAM 18, a control microcomputer 19, an analog front end 20, a motor amp 21, a spindle motor 22, a seek motor 24, a multiplexing processor 31, a video processor 32, and an audio processor 33.

In particular, the optical head 1 including the temperature sensor 4, the laser diode 3, the focus actuator 8, and the objective lens 9, the optical disc 2, the analog front end 20, the motor amp 21, the spindle motor 6, and the seek motor 24 constitute an optical disc device in the camcorder in FIG. 3. If an optical disc device or a laser diode control device to control the operation of a laser diode is concerned instead of the camcorder, the control microcomputer 19 and part of the DVD signal processor 16 (e.g., interface) are further included in the constitution. From a viewpoint of the present invention, the entire camcorder may also be involved.

Moreover, the playback RAM 17 and the recording RAM 18 may be formed in one RAM or two separate regions.

Further, the optical disc device, the laser diode control device, or the camcorder has a unit that operates in response to a clock signal. Thus, measurement of a temporal element or decision means (to be described) will not necessarily be dealt with here.

Going back to FIG. 3, the camera block 11 includes a charge coupled device (CCD), and a drive circuit and/or a video signal processing circuit such that the CCD driven by the drive circuit converts an optical image obtained through a lens into an electrical signal and the video signal processing circuit carries out picture quality adjustment and outputs the signal to the video processor 32 of the compression/expansion processing block 14. Meanwhile, the audio input block 12 converts sound taken by a sound source sensor such as a microphone into an electrical signal and outputs the signal to the audio processor 33 of the compression/expansion processing block 14.

The video processor 32 converts an inputted image into a digital image signal and outputs the signal to the multiplexing processor 31 and the video/audio encoder 13, respectively. The audio processor 33 converts the inputted sound to a digital image signal and outputs the signal to the multiplexing processor 31 and video/audio encoder 13, respectively. The video/audio encoder 13 outputs input video and audio data, under the control of the microcomputer.

The multiplexing processor 31 multiplexes the input video data and audio data and outputs it to the DVD signal processor 16.

The DVD signal processor 16 temporarily stores the compressed video and audio data inputted from the multiplexing processor 31 in the recording RAM 18 and outputs a DVD recording stream to the analog front end 20. At the same time, the DVD signal processor 16 outputs a servo system signal (this is used for playback as well) to the motor amp 21 to control a write operation on the optical disc 2. The playback RAM 17 is used for temporarily storing video and audio data that are read from the optical disc 2 and outputted from the analog front end 20 in form of a DVD playback stream during playback, and outputting the data to the multiplexing processor 31.

The analog front end 20 converts the DVD recording stream supplied from the DVD signal processor 16 to a current pulse and supplies it to the laser diode 3 of the optical head 1.

The laser diode 3 outputs a laser beam with a power level corresponding to the current value of the supplied current. The output laser beam is radiated onto a recording layer of the optical disc 2 through the collimating lens 5, the beam splitter 6, and the objective lens 9, thereby recording (write) or playback (read). At this time, the laser beam emitted from the laser diode 3 is splitted in part by the beam splitter 6 and enters the photo diode 25. The photo diode 25 detects intensity of the incoming light and outputs the detected intensity data to the analog front end 20. The analog front end 20 then decides whether a current laser beam power is suitable, based on the light intensity data being inputted. If so, the analog front end 20 supplies current as it is set. If not, however, the analog front end 20 changes a conversion rate for converting the DVD recording data stream that has been supplied from the DVD signal processor 16 to a current pulse and supplies current. Here, the analog front end 20 and the control microcomputer 19 always access data with each other and continuously update the setup conditions according to given circumstances.

The motor amp 21 outputs control signals in (1) to (4) and executes the control actions in (5) to (8).

In detail, the motor amp 21 receives a servo system signal from the analog front end 20 through the DVD signal processor 16, outputs, based on the received servo system signal, (1) a spindle control signal to the spindle motor 22, (2) a focus control signal to the focus actuator 8, (3) a tracking control signal to the tracking actuator 7, and (4) a seek control signal to the seek motor 24.

Then (5) the spindle motor 22 rotates the optical disc 2 in response to the spindle control signal, (6) the tracking actuator 7 calibrates a minute position misalignment in a radius direction (normal direction), e.g., a horizontal dithering during the rotation of the disc, in response to the tracking control signal (7) the focus actuator 8 adjusts the objective lens 9 in response to the focus control signal and changes a focus position of the laser beam radiated onto the optical disc 2, and (8) the seek motor 24 moves the optical head 1 in a radius direction (normal direction) of the optical disc 2 in response to the seek control signal so as to change the radiation position of the laser beam to a predetermined position of the optical disc 2.

The temperature sensor 4 is installed in the vicinity of the laser diode 3 to detect temperature of the laser diode 3 or temperature information, and outputs the detected temperature or the temperature information to the control microcomputer 19. The control microcomputer 19 realizes or learns temperature of the laser diode 3 out of the detected temperature or the temperature information provided from the temperature sensor 4, and accesses, if necessary, to the analog front end 20 to change the conversion rate of current value to be fed to the laser diode 3 or controls the supply startup or stop.

In addition, the control microcomputer 19 not only accesses between the analog front ends 20, but also between components of the camcorder in general such that the camcorder can be kept in proper operating state.

Figure 4:
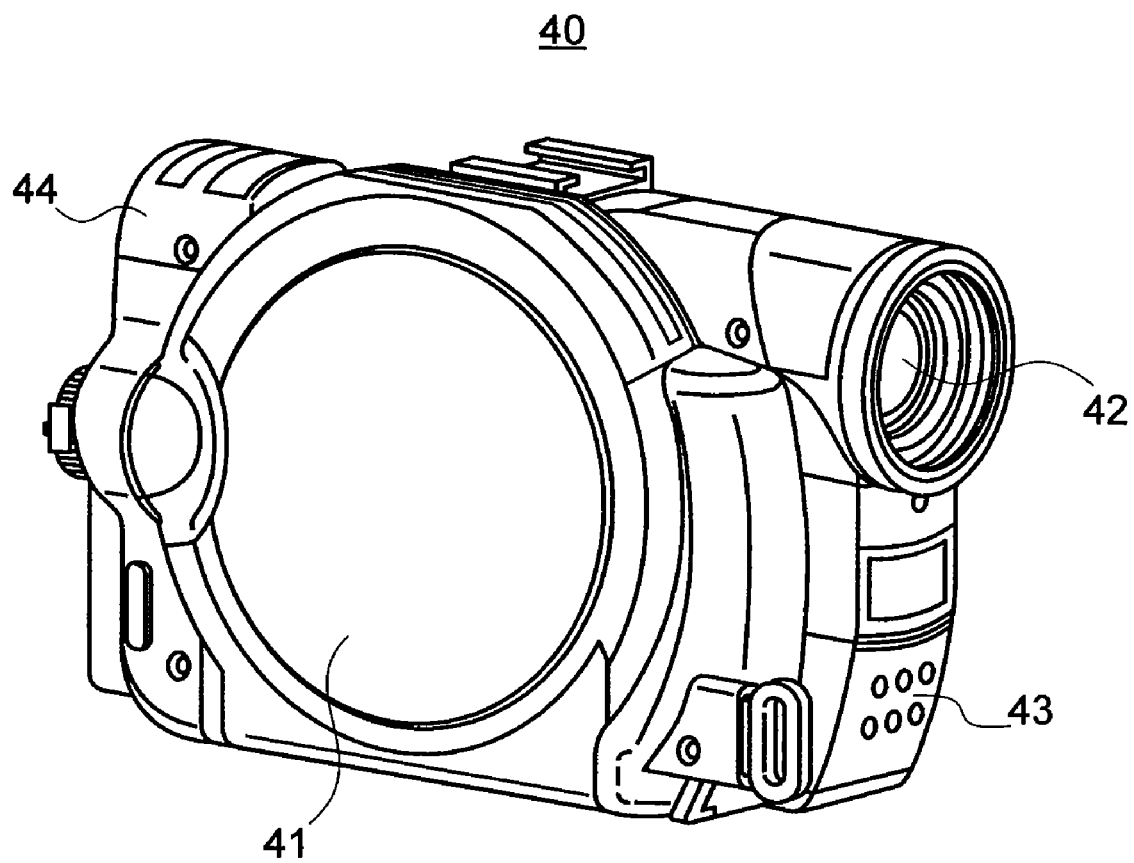
FIG. 4 is an exterior view of a camcorder to which the present invention is applied.

FIG. 4 is an external view of a camcorder provided as a reference. In the drawing, a camcorder 40 includes an optical disc device 41, a lens 42, a microphone 43, and a finder 44.

The optical disc device 41 is so constructed that it accept a removable medium, such as, an optical disc (e.g., DVD-RAM), from an outside, in a detachable manner, and therefore it is susceptible to an outside atmosphere, in particular, temperature thereof.

Although the embodiment in FIG. 3 illustrated a CCD area sensor as an imaging device, other CCD or pickup tube such as a complementary metal oxide semiconductor (CMOS) sensor may be used as a video camera for the camcorder. Further, an analog camera or a digital camera may also be used.

Figure 5:
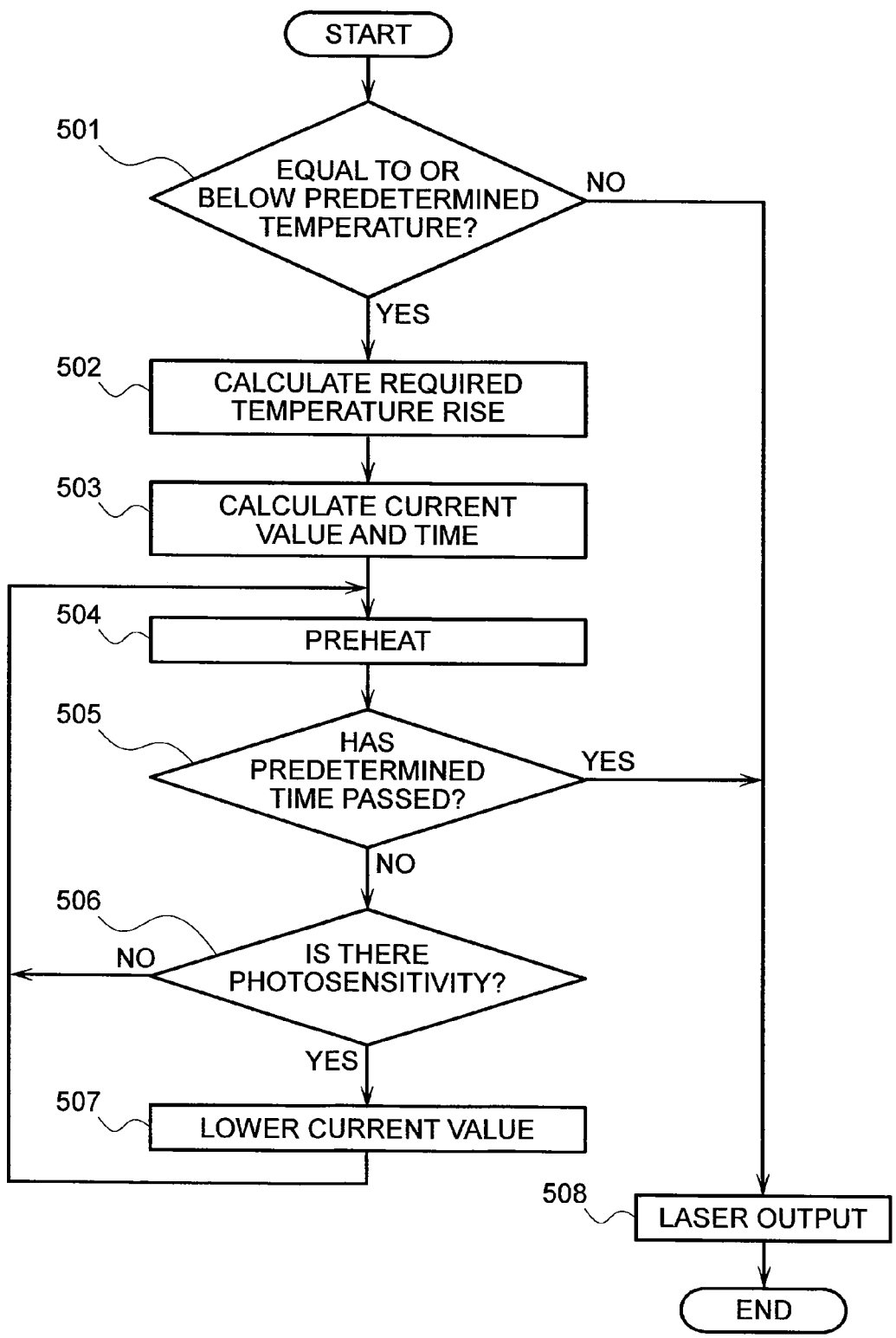
FIG. 5 is a flow chart to explain the operation procedure in a sequential order according to one embodiment of the present invention.

FIG. 5 explains one embodiment (Mode I) of the operation of the present invention optical disc device shown in FIG. 3. Referring to the flow chart in FIG. 5, the operation of the camcorder will now be explained in a sequential procedure.

For subsequent operations, the control microcomputer 19 accesses all necessary components inside the camcorder according to an operational program of the camcorder (e.g., taking information and executing a control). In addition, data that is required to decide, calculate or refer to an operational program is preserved in advance in a memory (not shown) in the control microcomputer 19 for example, such that the control microcomputer 19 may withdraw the data, and contents of the data are also updated according to needs. Also, the temperature sensor 4 detects temperature of the laser diode 3 at a preset time intervals that would not impede the processing operations of the control microcomputer 19 and outputs it to the control microcomputer 19. The photodiode and other detection components operate in a similar manner.

Referring to FIG. 5, when a user uses an interface such as a button and commands writing (recording) or reading (playback) to or from a camcorder or an optical disc, the operation after step S501 starts.

First of all, in step S501, the control microcomputer 19 decides whether temperature of the laser diode 3 detected by the temperature sensor 4 is equal to or below the predetermined temperature. If the temperature of the laser diode 3 is equal to or below the predetermined temperature, the control microcomputer proceeds to step S502; otherwise, it proceeds to step S508.

In step S508, a laser beam is emitted and the typical operation where the user can write (record) or read (playback) to or from the camcorder or the optical disc is carried out. That is, the camcorder executes writing (recording) or reading (playback) a photographed image onto or from a disc, e.g., DVD-RAM, which is set to the optical disc device, and ends the operation after the writing (recording) or reading (playback) operation is performed.

In step S502, the control microcomputer 19 calculates a temperature difference between the current laser diode temperature and the predetermined temperature as a temperature rise.

In step S503, the control microcomputer 19 acquires a maximum current value where no laser beam is outputted at the present temperature (i.e. a threshold current value Ith at the detected temperature) by referring to I-L characteristic data (shown in FIG. 1 or FIG. 2, et al.), and calculates, by referring to a temperature table or using a given equation, an amount of time required to raise the temperature of the laser diode 3 as much as a required temperature rise when the threshold current value Ith was used as the supply current. And the control microcomputer 19 outputs the acquired current value to be supplied to the analog front end 20. In general, a camcorder retains data on temperature characteristics which are already measured during shipping in a built-in memory of the control microcomputer 19 for example in form of a table or an equation (to be described later in reference to FIG. 7).

In step S504, the analog front end 20 provides the current of the current value which the control microcomputer 19 has commanded to the laser diode 3 (the laser diode 3 will be preheated).

In step S505, the control microcomputer 19 decides whether the calculated amount of time has elapsed. If no, it proceeds to step S506; otherwise, it stops the current supply and proceeds to step S508.

The current supply may be continued until the operation in step S508 starts.

Instead of calculating time, it is also possible to issue a command again after a preset amount of time has lapsed, by recalculating a value of the temperature sensor for a start-up.

In step S506, the control microcomputer 19 receives from the analog front end 20 a detection result of an incoming light intensity provided by the photodiode 25. If light is detected ("Yes"—whether photosensitivity is available), it proceeds to step S507; otherwise, it proceeds to step S504.

In step S507, the control microcomputer 19 issues a command for that the analog front end 20 to lower the value of supplied current by a predetermined value from the present value of supplied current. And after the front end 20 lowered current value, the control microcomputer 19 proceeds to step S504.

As has been explained so far, according to the embodiment in FIG. 5, even at a low temperature outside the operation guarantee temperature range incapable of outputting a laser beam, a current equal to or below the threshold current value may be impressed to the laser diode to increase its temperature without outputting a laser beam. In so doing, the laser diode temperature gets into the operation guarantee temperature range and starts outputting a laser beam, such that a normal writing or reading operation can be performed.

Figure 6:
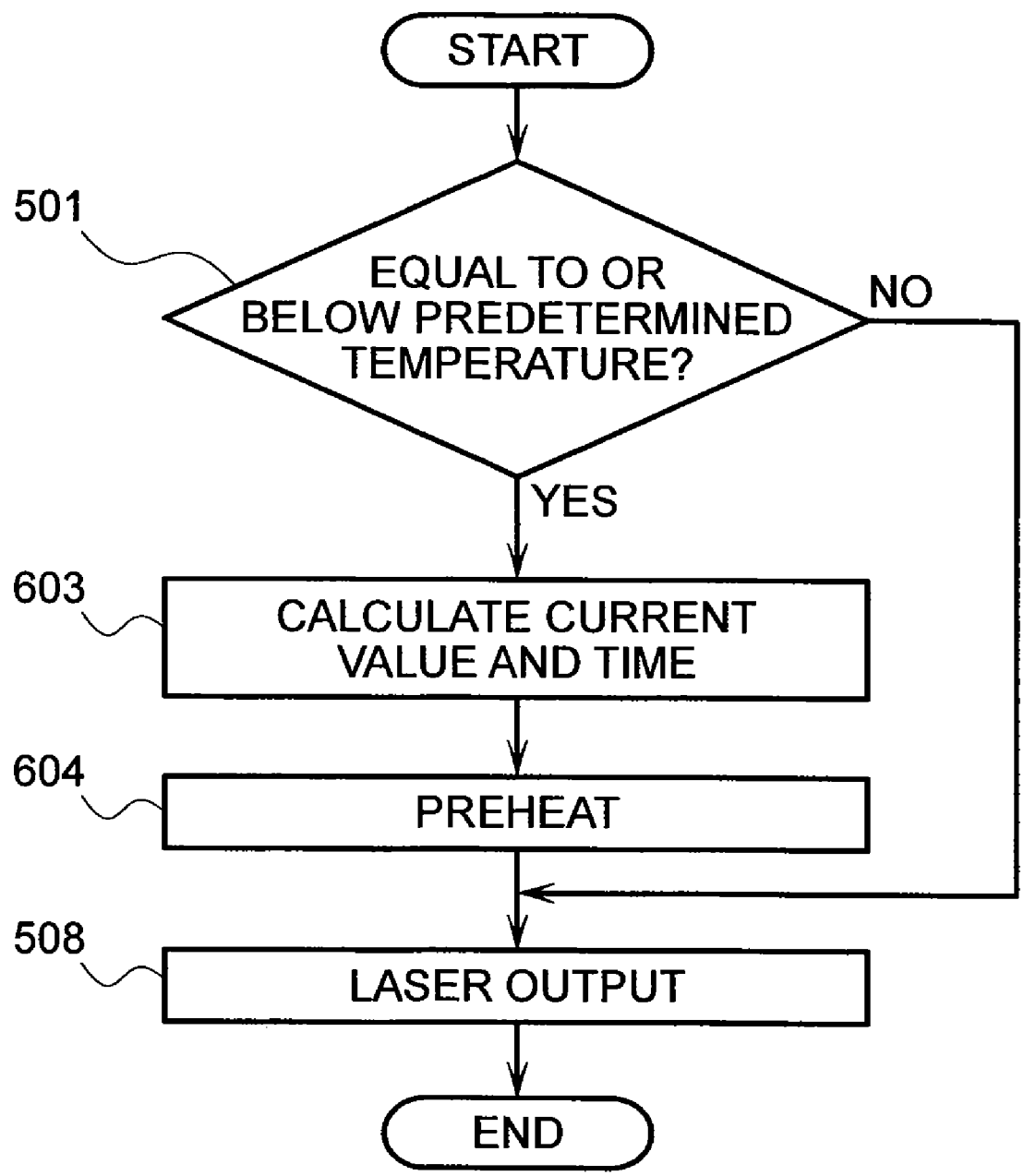
FIG. 6 is a flow chart to explain the operation procedure in a sequential order according to one embodiment of the present invention.

Next, the following will now describe another embodiment (Mode II) of the operation of the present invention optical disc device, with reference to FIG. 6 and FIG. 3. FIG. 6 is a flow chart for explaining the operation of the camcorder in a sequential procedure, which is more simplified than the operation in the Mode I in FIG. 5.

For subsequent operations, the control microcomputer 19, as is done in FIG. 5, accesses all necessary components inside the camcorder according to an operational program of the camcorder (e.g., taking information and executing a control). In addition, data that is required to decide, calculate or refer to an operational program are preserved in advance in a memory (not shown) in the control microcomputer 19 for example, such that the control microcomputer 19 may withdraw the data, and contents of the data are also updated according to needs. Also, the temperature sensor 4 detects temperature of the laser diode 3 at a preset time intervals that would not impede the processing operations of the control microcomputer 19 and outputs it to the control microcomputer 19. The photodiode and other detection components operate in a similar manner.

Referring to FIG. 6, when a user uses an interface such as a button and commands writing (recording) or reading (playback) to or from a camcorder or an optical disc, the operation after step S501 starts.

First of all, in step S501, the control microcomputer 19 decides whether temperature of the laser diode 3 detected by the temperature sensor 4 is equal to or below the predetermined temperature. If the temperature of the laser diode 3 is equal to or below the predetermined temperature, the control microcomputer proceeds to step S603; otherwise, it proceeds to step S508.

In step S508, a laser beam is emitted and the typical operation where the user can write (record) or read (playback) to or from the camcorder or the optical disc is carried out. That is, the camcorder executes recording of a photographed image onto a disc, e.g., DVD-RAM, which is set to the optical disc device, and ends the operation after the writing (recording) or reading (playback) operation is performed.

In step S603, as is done in the step S502 of FIG. 5, the control microcomputer 19 calculates a temperature difference between the current laser diode temperature and the predetermined temperature as a temperature rise. Moreover, the microcomputer 19 acquires a maximum current value where no laser beam is outputted at the current temperature (i.e. a threshold current value Ith at the detected temperature) by referring to I-L characteristic data (shown in FIG. 1 or FIG. 2, et al.), and calculates, by referring to a temperature table or using a given equation, an amount of time required to raise the temperature of the laser diode 3 as much as a required temperature rise when the threshold current value Ith was used as the supply current. And the control microcomputer 19 outputs the current value to be supplied and time (a preset amount of time) to the analog front end 20. In general, a camcorder retains data on temperature characteristics which are already measured during shipping in a built-in memory of the control microcomputer 19 for example in form of a table or an equation (to be described later in reference to FIG. 7).

In step S604, the analog front end 20 provides the current of the current value which the control microcomputer 19 has commanded to the laser diode 3 (the laser diode 3 will be preheated). After a preset amount of time being commanded lapses, the control microcomputer 19 stops the current supply and proceeds to step S508.

The current supply may be continued until the operation in step S508 starts.

As has been explained so far, even at a low temperature outside the operation guarantee temperature range incapable of outputting a laser beam, a current equal to or below the threshold current value may be supplied to the laser diode to increase its temperature without outputting a laser beam. In so doing, the laser diode temperature gets into the operation guarantee temperature range and starts outputting a laser beam, such that a normal writing or reading operation can be performed.

Figure 7:
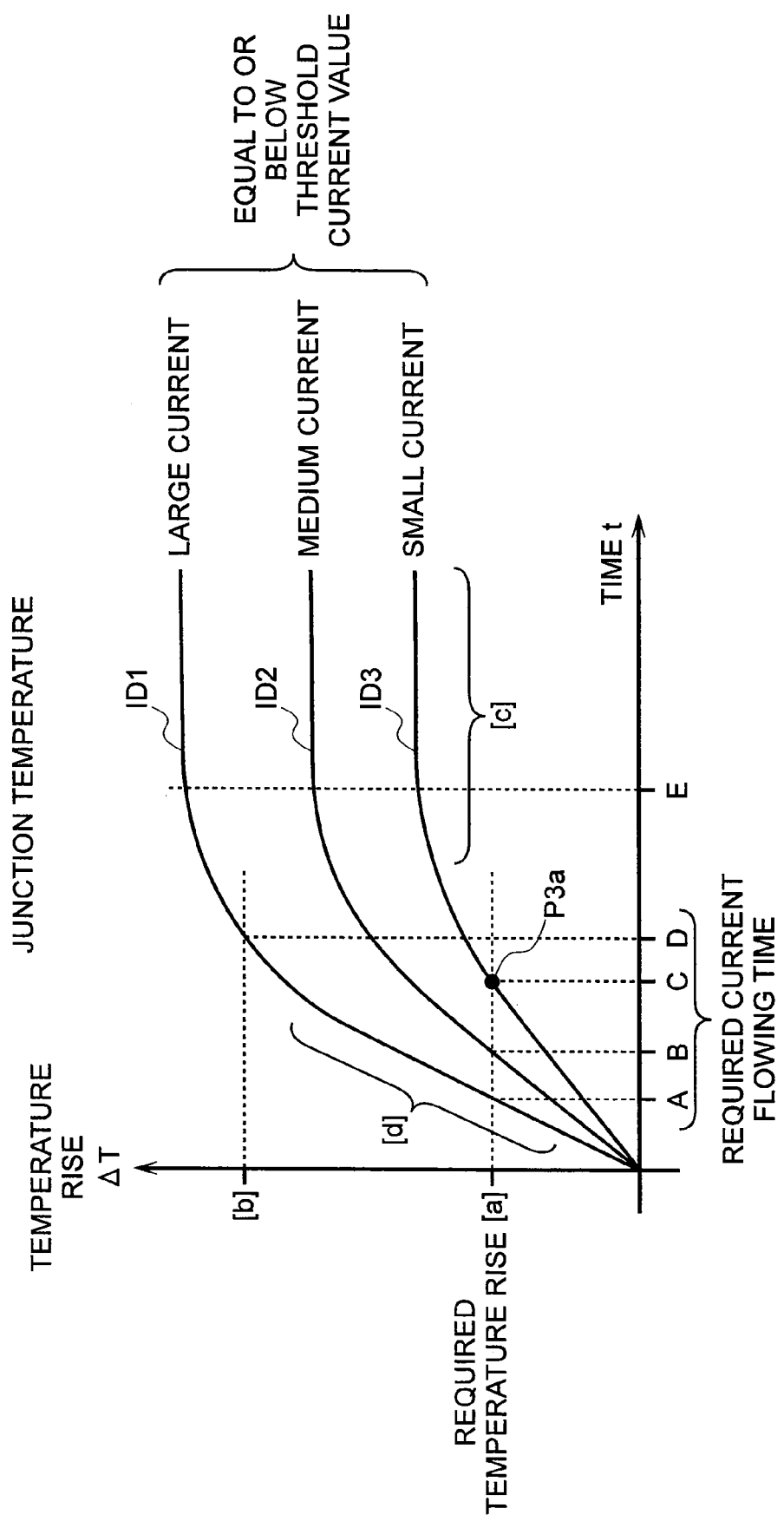
FIG. 7 shows quantitative results of temperature rise characteristics of an LD with current supply time as a horizontal axis after feeding a current equal to or below a threshold current value to an LD.

The following will now explain a table or an equation required for the processing operation in FIG. 5 (Mode I) or FIG. 6 (Mode II), with reference to FIG. 7. FIG. 7 is a diagram illustrating quantitative results of temperature rise characteristics of a laser diode with current supply time as a horizontal axis when a current equal to or below a threshold current value is fed to a laser diode (the supply current is used as a parameter). In the drawing, curve ID1 is an elapsed time-temperature rise curve when the supply current is large, curve ID2 is an elapsed time-temperature rise curve when the supply current is middle, and curve ID3 is an elapsed time-temperature rise curve when the supply current is small.

When a threshold current value is expressed as small current, middle current, and large current, a temperature rise ΔT of the laser diode at an elapsed time t differs by laser diodes, resulting in different temperature characteristic values. Therefore, temperature characteristics of a laser diode used for a camcorder, an optical disc device, or a laser diode itself are acquired respectively during shipping, and data on the acquired temperature characteristics are stored in a memory (e.g., a non-volatile memory (not shown) built in the control microcomputer 19) inside a camcorder. It is also acceptable to obtain temperature characteristics including inequality from experiments in advance and store them in the memory.

In step S503 of FIG. 5 the control microcomputer 19 obtains the supply current (equal to or below a threshold current value at a given temperature) from the I-L characteristic data. In step S502, the control microcomputer 19 calculates an amount of time for reaching a temperature rise [a] having been calculated, referring to a table based on the graph shown in FIG. 7 or using an equation.

For example, in the graph of FIG. 7, when the supply current is used small current as a parameter, it is possible to obtain time C crossing the temperature rise [a] based on point P3a, an junction between the curve ID3 and the line of the required temperature rise [a] and an elapsed time t at the point P3a.

Step S603 in FIG. 6 is carried out similarly to the above-described steps S502 and S503.

Going back to FIG. 7, when a current equal to or below a threshold value Ith is applied to a laser diode, no laser beam is outputted. Therefore, most electric energy thereof is converted to heat energy at a junction of the laser diode. Suppose that heat capacity at the junction is Tc (unit: [J/° C.], and given heat quantity is Q (unit: [J]). Then temperature rise ΔT (unit: [° C.]) at the junction can be obtained by Equation (1) below:

$$\Delta T = Q/Tc \qquad \text{Equation (1)}$$

Heat quantity Q and power P (unit: [W]) satisfy a relationship expressed in Equation (2):

$$Q = P \times t = (Id \times Vd \times t) \qquad \text{Equation (2)}$$

where, t is time (unit: [s]), Id is a supply current (unit: [A]), and Vd is a supply voltage (unit: [V]).

Substituting the Equation (1) to the Equation (2), Equation (3) is obtained:

$$\Delta T = (Id \times Vd \times t)/Tc \qquad \text{Equation (3)}$$

If the supply current Id and the supply voltage Vd are constant, power P becomes constant as well. In such case, since a constant heat quantity Q is given all the time, the temperature rise ΔT is increased proportionally to the elapsed time t (shown in FIG. 7[d]). In reality, however, heat goes off from the junction, heat quantity Qo=a×(Tj-T0) escapes. Here, "a" is a thermal conductivity, Tj is the temperature at an junction (unit: [° C.]), and T0 is an ambient temperature (unit: [° C.]). Since heat quantity Qo being escaped is increased as the temperature at an junction is higher, a saturated state is resulted as shown in FIG. 7[c]. Also, since it takes longer time to the saturated state if a threshold current value is larger (e.g., an elapsed time D at the temperature rise [b] in FIG. 7), it becomes possible to heat the laser diode even more as a threshold current value is larger.

Figure 8:
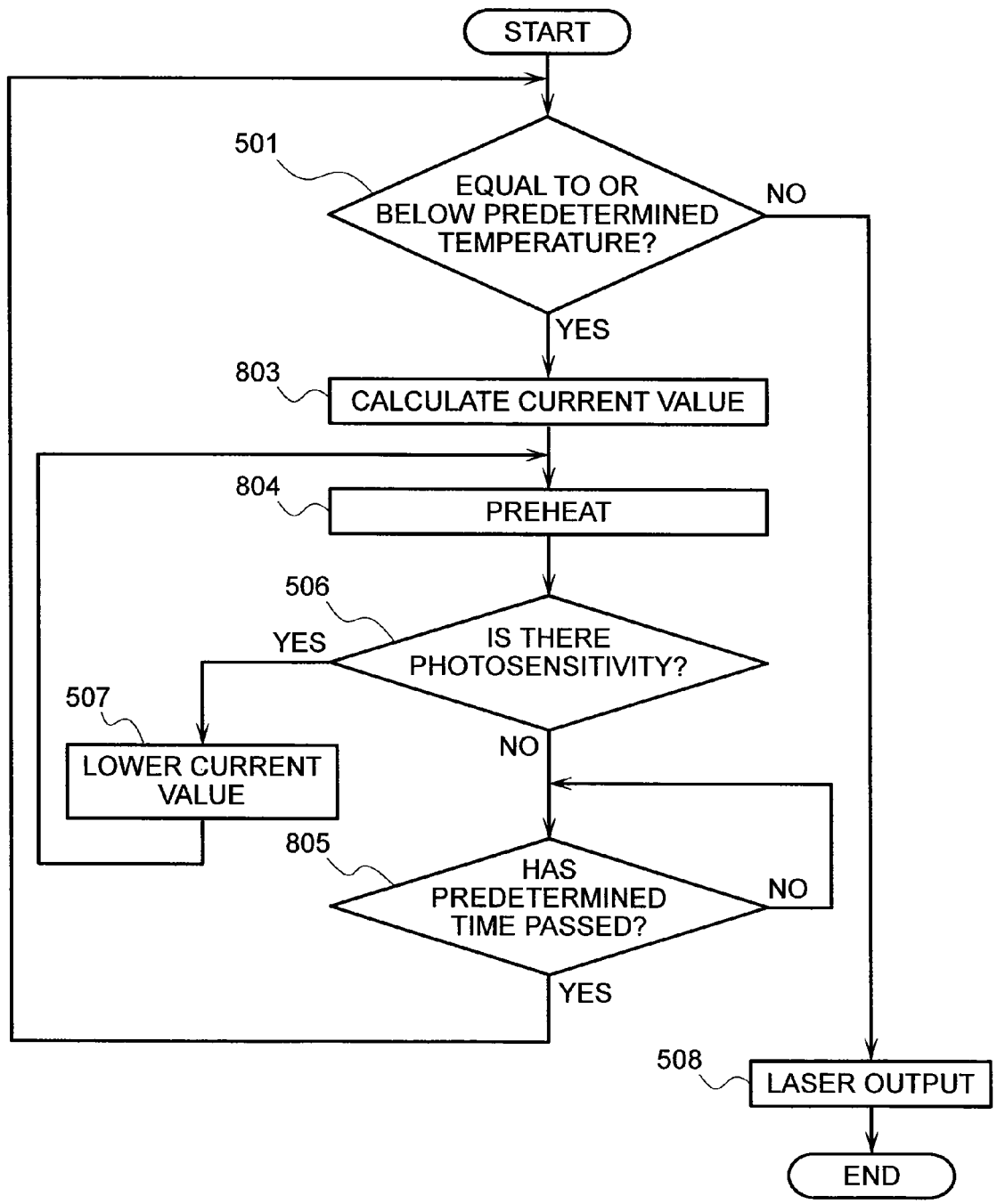
FIG. 8 is a flow chart to explain the operation procedure in a sequential order according to one embodiment of the present invention.

Therefore, when operations are carried out as in Mode III of FIG. 8 by modifying the sequence of operations in the flow chart of Mode I shown in FIG. 5, the method and device for current control of a laser diode and a camcorder according to the present invention can yield even better outcomes. FIG. 8 is a flow chart for explaining a sequence of operations according to one embodiment (Mode III) of the present invention.

For subsequent operations, the control microcomputer 19 accesses all necessary components inside the camcorder according to an operational program of the camcorder (e.g., taking information and executing a control). In addition, data that is required to decide, calculate or refer to an operational program are preserved in advance in a memory (not shown) in the control microcomputer 19 for example, such that the control microcomputer 19 may withdraw the data, and contents of the data are also updated according to needs. Also, the temperature sensor 4 detects temperature of the laser diode 3 at a preset time intervals that would not impede the processing operations of the control microcomputer 19 and outputs it to the control microcomputer 19. The photodiode and other detection components operate in a similar manner.

Referring to FIG. 8, when a user uses an interface such as a button and commands writing (recording) or reading (playback) to or from a camcorder or an optical disc, the operation after step S501 starts.

First of all, in step S501, the control microcomputer 19 decides whether temperature of the laser diode 3 detected by the temperature sensor 4 is equal to or below the predetermined temperature. If the temperature of the laser diode 3 is equal to or below the predetermined temperature, the control microcomputer proceeds to step S803; otherwise, it proceeds to step S508.

In step S508, a laser beam is emitted and the typical operation where the user can write (record) or read (playback) to or from the camcorder or the optical disc is carried out. That is, the camcorder records a photographed image onto a disc, e.g., DVD-RAM, which is set to the optical disc device, and ends the operation after the writing (recording) or reading (playback) operation is performed.

In step S803, the microcomputer 19 acquires a maximum current value where no laser beam is outputted at the current temperature (i.e. a threshold current value Ith at the detected temperature) by referring to I-L characteristic data (shown in FIG. 1 or FIG. 2, et al.), and calculates, by referring to a temperature table or using a given equation, an amount of time required to raise the temperature of the laser diode as much as a required temperature rise when the threshold current value Ith was used as the supply current. And the control microcomputer 19 outputs the current of the current value to be supplied and time (a preset amount of time) to the analog front end 20. In general, a camcorder retains data on temperature characteristics which are already measured during shipping in a built-in memory of the control microcomputer 19 for example in form of a table or a equation.

In step S804, the analog front end 20 provides the current value which the control microcomputer 19 has commanded to the laser diode 3 (the laser diode 3 will be preheated), and the control microcomputer 19 proceeds to step S506.

In step S506, the control microcomputer 19 receives from the analog front end 20 a detection result on the intensity of an incident light to the photodiode 25 through a condenser lens 10. If light is detected ("Yes"—whether photosensitivity is available), it proceeds to step S507; otherwise, it proceeds to step S805.

In step S507, the control microcomputer 19 issues a command to lower the current value that the analog front end 20 supplies by a predetermined value to get a lower current value, and returns to step S804.

In step S805, the control microcomputer 19 monitors whether a preheating time passed a preset amount of time. If the preset amount of time has not yet lapsed, it continues monitoring; otherwise, it returns to step S501.

In step S501, the control microcomputer 19 checks temperature of the laser diode again, which the temperature has been increased by preheating. If the laser diode temperature exceeds the predetermined temperature, the control microcomputer 19 proceeds to step S508; otherwise, it proceeds to step S803 and further, and supplies a maximum current value where no laser beam is outputted at the current temperature (i.e. a threshold current value Ith at the detected temperature) to the laser diode.

As such, the embodiment of FIG. 8 (Mode III) showed that a laser diode at low temperature can reach the operation guarantee temperature quickly and efficiently by monitoring the temperature of the laser diode at a predetermined cycle (interval) and always supplying a maximum current that does not output a laser beam to the laser diode. This enables a quick and efficient writing (recording) operation or reading (playback) operation to or from an optical disc.

The predetermined cycle or time interval may vary according to a temperature range. For instance, a long cycle may be set if the laser diode temperature is low, while a short cycle may be set if the laser diode temperature is high. Also, if the laser diode temperature is within a high temperature range, it is possible to reduce the cycle gradually by setting the temperature range small.

As has been explained so far, even at a low temperature outside the operation guarantee temperature range incapable of outputting a laser beam, a current equal to or below the threshold current value may be impressed to the laser diode to increase its temperature. In so doing, the laser diode temperature gets into the operation guarantee temperature range and starts outputting a laser beam, such that a normal writing or reading operation can be performed.

Figure 9:
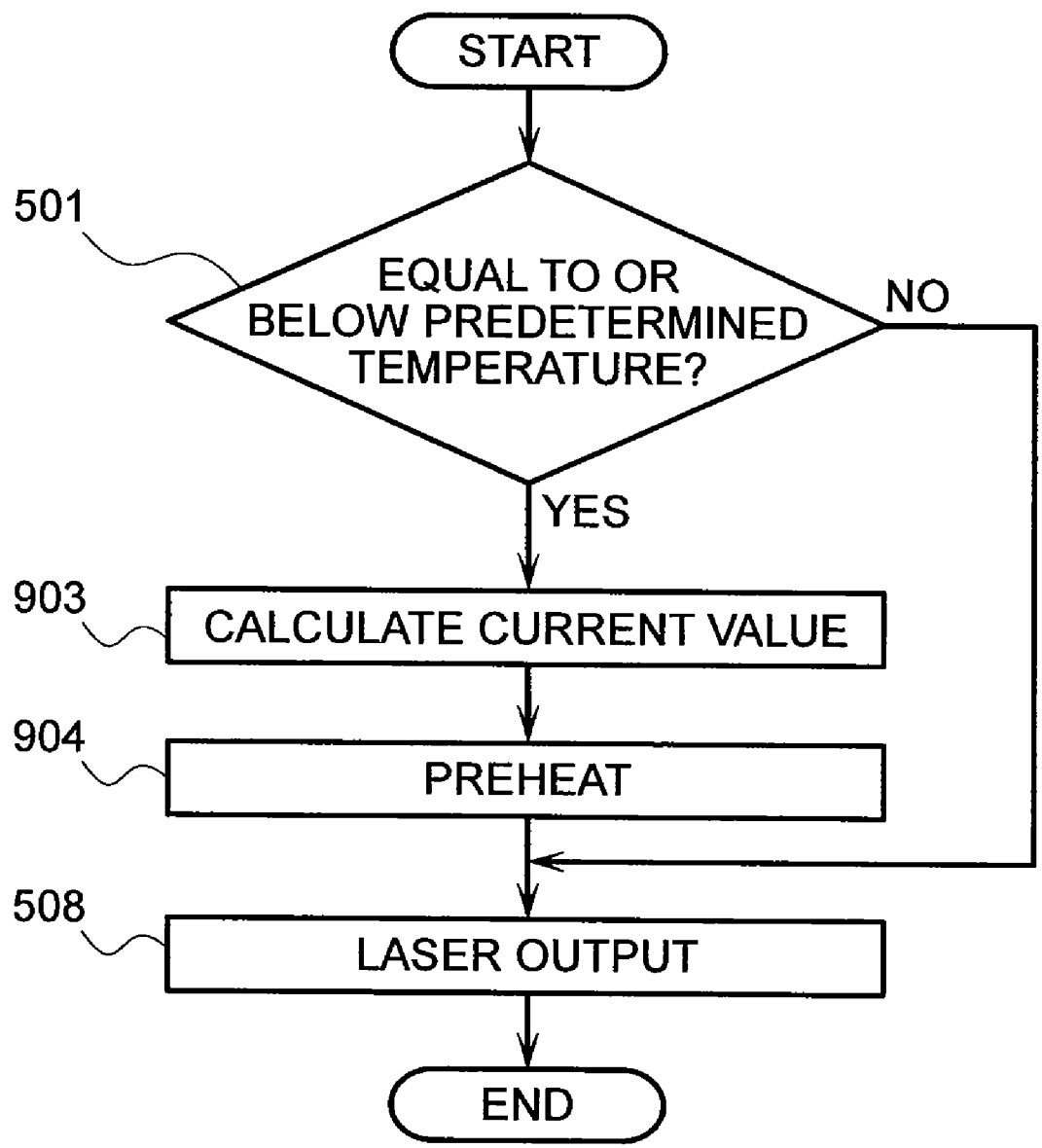
FIG. 9 is a flow chart to explain the operation procedure in a sequential order according to one embodiment of the present invention.

Still another embodiment (Mode IV) will now be described with reference to FIG. 9. FIG. 9 is a flow chart illustrating a sequence of operations for heating a laser diode to the operation guarantee temperature range in a simple way.

In FIG. 9, when a user uses an interface such as a button and commands writing (recording) or reading (playback) to or from a camcorder or an optical disc, the operation after step S501 starts.

First of all, in step S501, the control microcomputer 19 decides whether temperature of the laser diode 3 detected by the temperature sensor 4 is equal to or below the predetermined temperature. If the temperature of the laser diode 3 is equal to or below the predetermined temperature, the control microcomputer proceeds to step S903; otherwise, it proceeds to step S508.

In step S508, a laser beam is emitted and the typical operation where the user can write (record) or read (playback) to or from the camcorder or the optical disc is carried out. That is, the camcorder records a photographed image onto a disc, e.g., DVD-RAM, which is set to the optical disc device, and ends the operation after the writing (recording) or reading (playback) operation is performed.

In step S903, the microcomputer 19 acquires a maximum present value where no laser beam is outputted at the current temperature (i.e. a threshold current value Ith at the detected temperature) by referring to I-L characteristic data (shown in FIG. 1 or FIG. 2, et al.), and calculates, by referring to a temperature table or using a given equation, an amount of time required to raise the temperature of the laser diode 3 as much as a required temperature rise when the threshold current value Ith was used as the supply current. As for a current value to be supplied, the control microcomputer 19 refers to saturation time (time E in FIG. 7) from temperature characteristic data of FIG. 7, and outputs the threshold current value Ith and time (a preset amount of time) to the analog front end 20. In general, a camcorder retains data on temperature characteristics which are already measured during shipping in a built-in memory of the control microcomputer 19 for example in form of a table or a equation.

In step S904, the analog front end 20 provides the current value which the control microcomputer 19 has commanded to the laser diode 3 (the laser diode 3 is the laser diode 3 will be preheated), and the control microcomputer 19 proceeds to step S508.

In the case of the embodiment of FIG. 9 (Mode IV), a current greater than a threshold current value Ith may be fed to the laser diode when the laser diode temperature is being raised, emitting a laser beam. Therefore, a laser beam radiating position should be deviated or diverted from the location of a recording medium, or a pickup should be moved to a place irrelevant to a recording region (writing region or reading region) of the recording medium (i.e., a region outside the recording region) so as to change the radiating position. Moreover, a focus may be put wrongly, that is, the focus position of the laser beam may be set at other part besides the recording layer of a recording medium. In step S508, the supply current is set to zero for once, and then the radiating position and the focus position go back to their former settings to start a writing operation or a reading operation.

As has been explained so far, even at a low temperature outside the operation guarantee temperature range incapable of outputting a laser beam, a current equal to or below the threshold current value may be impressed to the laser diode to increase its temperature. In so doing, the laser diode temperature gets into the operation guarantee temperature range and starts outputting a laser beam, such that a normal writing or reading operation can be performed.

Still another embodiment of the present invention will now be described with reference to FIG. 10. In this embodiment, a camcorder or an optical disc device has an ON/OFF setup function for a low-temperature standby mode, such that when a user sets the camcorder or the optical disc device in the low-temperature standby mode, one of the embodiments described in FIG. 5, FIG. 6, FIG. 8 and FIG. 9 (one of Mode I through Mode IV) is carried out in a sequential order as indicated in the flow chart of FIG. 10.

In particular, the low-temperature standby mode is advantageous for preventing dew condensation on a laser diode. For example, when a user exchanges a removable medium in an optical disc device, an opening/closing cover for the optical disc device is opened and closed, making a laser diode therein susceptible to dew condensation. At this time, by turning off the low-temperature standby mode, dews are not formed on the laser diode and a decrease in life span of the laser diode due to damages for example can be prevented.

Another way is to set the low-temperature standby mode to be turned off automatically for a certain period of time whenever the cover of the optical disc device is either opened or closed, and let a finder to show a warning of that intention.

Figure 10:
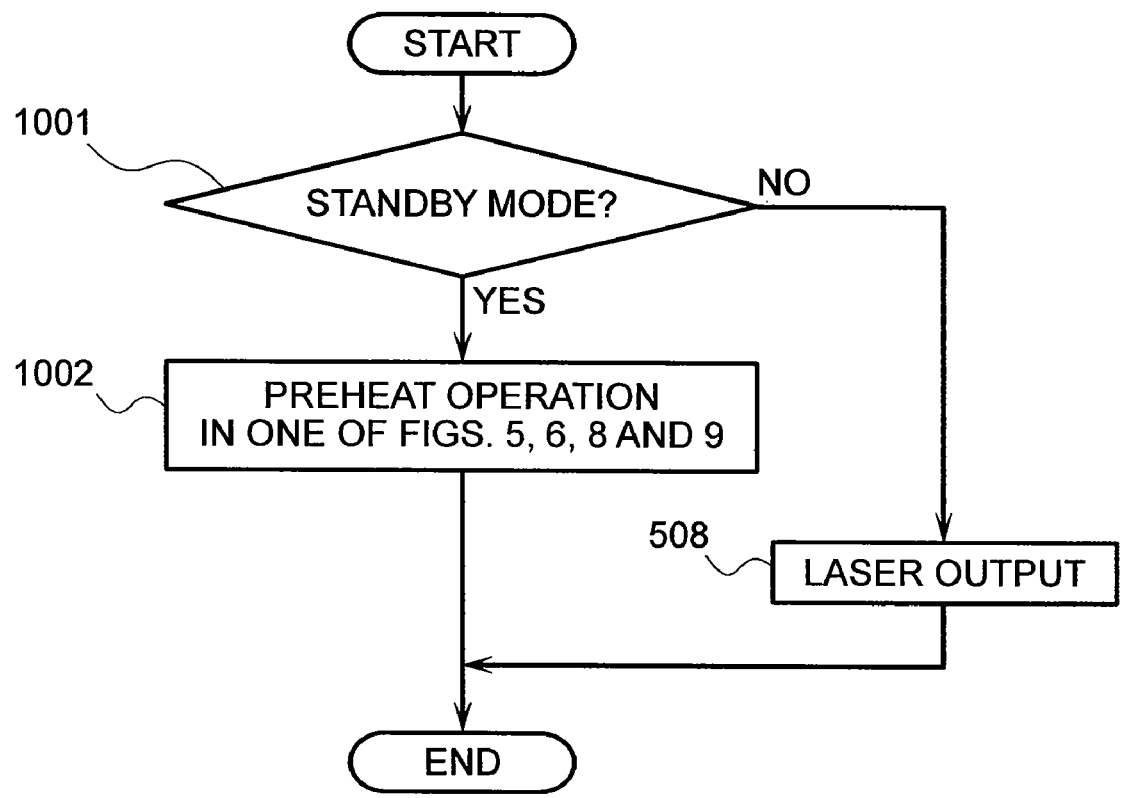
FIG. 10 is a flow chart to explain the operation procedure according to one embodiment of the present invention.

Referring to the embodiment of FIG. 10, when a user uses an interface such as a button and commands writing (recording) or reading (playback) to or from a camcorder or an optical disc, the operation after step S1001 starts.

In step S1001, the control microcomputer 19 decides whether the user has set the low-temperature standby mode of a camcorder or an optical disc device to ON. If the low-temperature standby mode is set to ON, the control microcomputer 19 proceeds to step S1002. If the low-temperature standby mode is set to OFF, however, the control microcomputer 19 executes a writing (recording) operation or a reading (playback) operation in step S508 discussed earlier with referred to FIG. 5 and others.

In step S1002, a preheating operation is carried out as is done in the embodiments of FIG. 5, FIG. 6, FIG. 8 and FIG. 9.

As has been explained so far, even at a low temperature outside the operation guarantee temperature range incapable of outputting a laser beam, a current equal to or below the threshold current value may be impressed to the laser diode to increase its temperature. In so doing, the laser diode temperature gets into the operation guarantee temperature range and starts outputting a laser beam, such that a normal writing or reading operation can be performed.

Figure 11:
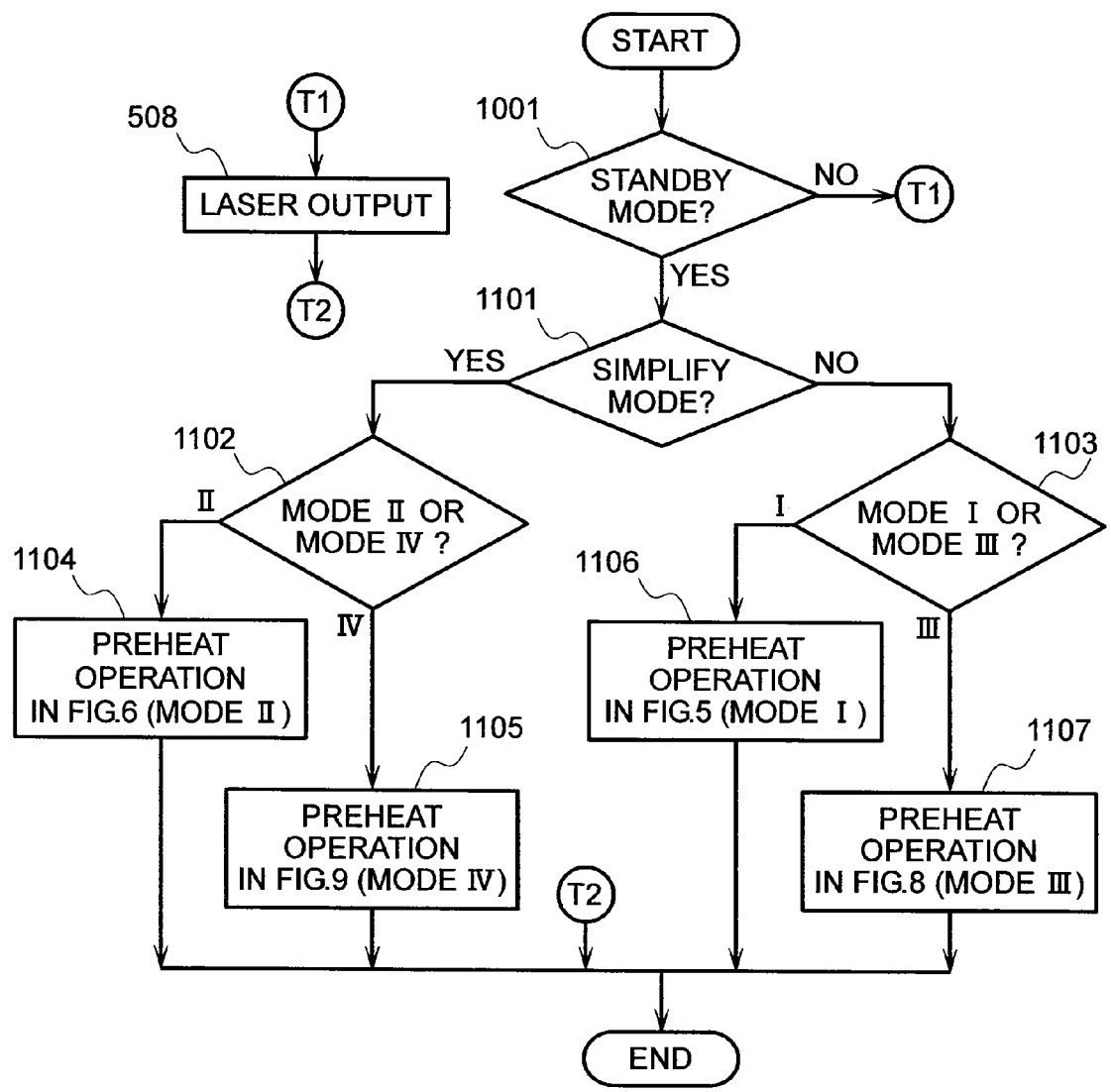
FIG. 11 is a flow chart to explain the operation procedure according to one embodiment of the present invention.

FIG. 11 describes yet another embodiment of the present invention, in which a user is allowed not only to do ON/OFF setup of the low-temperature standby mode as in the embodiment of FIG. 10, but also to select a desired kind of the low-temperature standby mode according to his or her circumstances. For example, the user may choose one of operation modes (Mode I through Mode IV) of FIG. 5, FIG. 6, FIG. 8, and FIG. 9 to be executed.

With this mode, the user is now able to select a desired mode or a kind of the low-temperature standby mode according to necessity of shooting, environment conditions, conditions of electronic equipment like a camcorder, such that user convenience is greatly improved.

Referring to FIG. 11, in step S1001, the control microcomputer 19 decides whether the user has set the low-temperature standby mode of a camcorder or an optical disc device to ON. If the low-temperature standby mode is set to ON, the control microcomputer 19 proceeds to step S1101. If the low-temperature standby mode is set to OFF, however, the control microcomputer 19 executes a writing (recording) operation or a reading (playback) operation in step S508 discussed earlier with referred to FIG. 5 and others.

Under limited space of the drawing in FIG. 11, the step S508 is depicted separately, and the operation sequence of the step S508 (although this has already been discussed in FIG. 10) is connected in use of T1 and T2.

In step S1101, the control microcomputer 19 decides whether a simple mode (automatic mode) is set by a user. If the simple mode is set, it proceeds to step S1102; otherwise, it proceeds to step S1103.

In step S1102, the control microcomputer 19 decides whether Mode II (shown in FIG. 6) or Mode IV (shown in FIG. 9) is set as the operation mode by a user. If Mode II is set, it proceeds to step S1104; if Mode IV is set, it proceeds to step S1105.

In step S1103, the control microcomputer 19 decides whether Mode I (shown in FIG. 5) or Mode III (shown in FIG. 8) is set as the operation mode by a user. If Mode I is set, it proceeds to step S1106; if Mode III is set, it proceeds to step S1107.

In step S1104, the sequence of operations (S501 to S508) for Mode II (shown in FIG. 6) are carried out.

In step S1105, the sequence of operations (S501 to S508) for Mode IV (shown in FIG. 9) are carried out.

In step S1106, the sequence of operations (S501 to S508) for Mode I (shown in FIG. 5) are carried out.

In step S1107, the sequence of operations (S501 to S508) for Mode III (shown in FIG. 8) are carried out.

As has been explained so far, even at a low temperature outside the operation guarantee temperature range incapable of outputting a laser beam, a current equal to or below the threshold current value may be impressed to the laser diode to increase its temperature. In so doing, the laser diode temperature gets into the operation guarantee temperature range and starts outputting a laser beam, such that a normal writing or reading operation can be performed.

Figure 12:
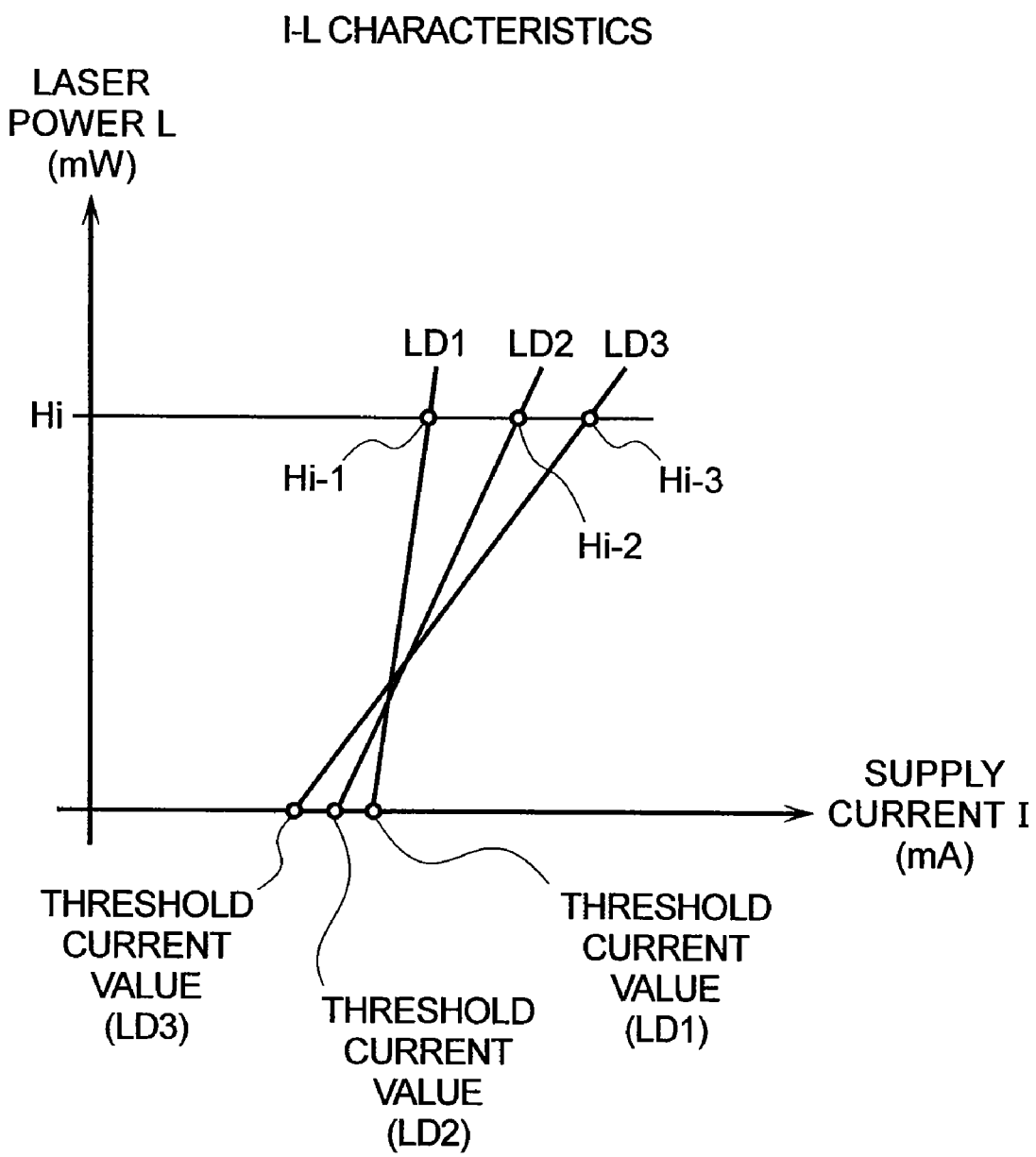
FIG. 12 is a diagram for explaining inequality in I-L characteristics of different LDs.

The following will now describe still another embodiment of the present invention with reference to FIG. 12, FIG. 1, FIG. 2, and FIG. 4. FIG. 12 is a diagram for explaining inequality in I-L characteristics of different laser diodes.

Figure 1:
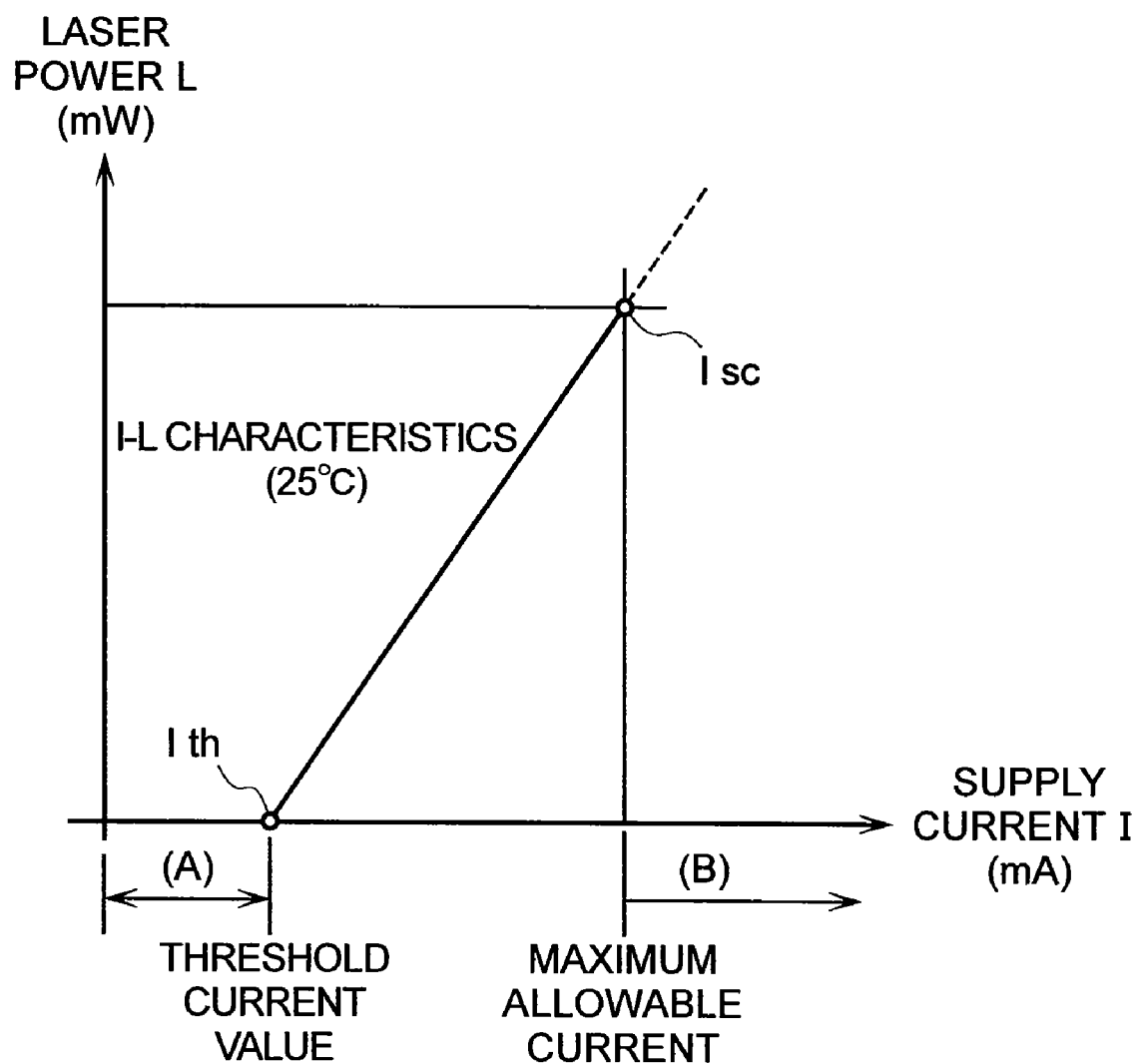
FIG. 1 illustrates one example of I-L characteristics of a laser diode (LD)
Figure 2:
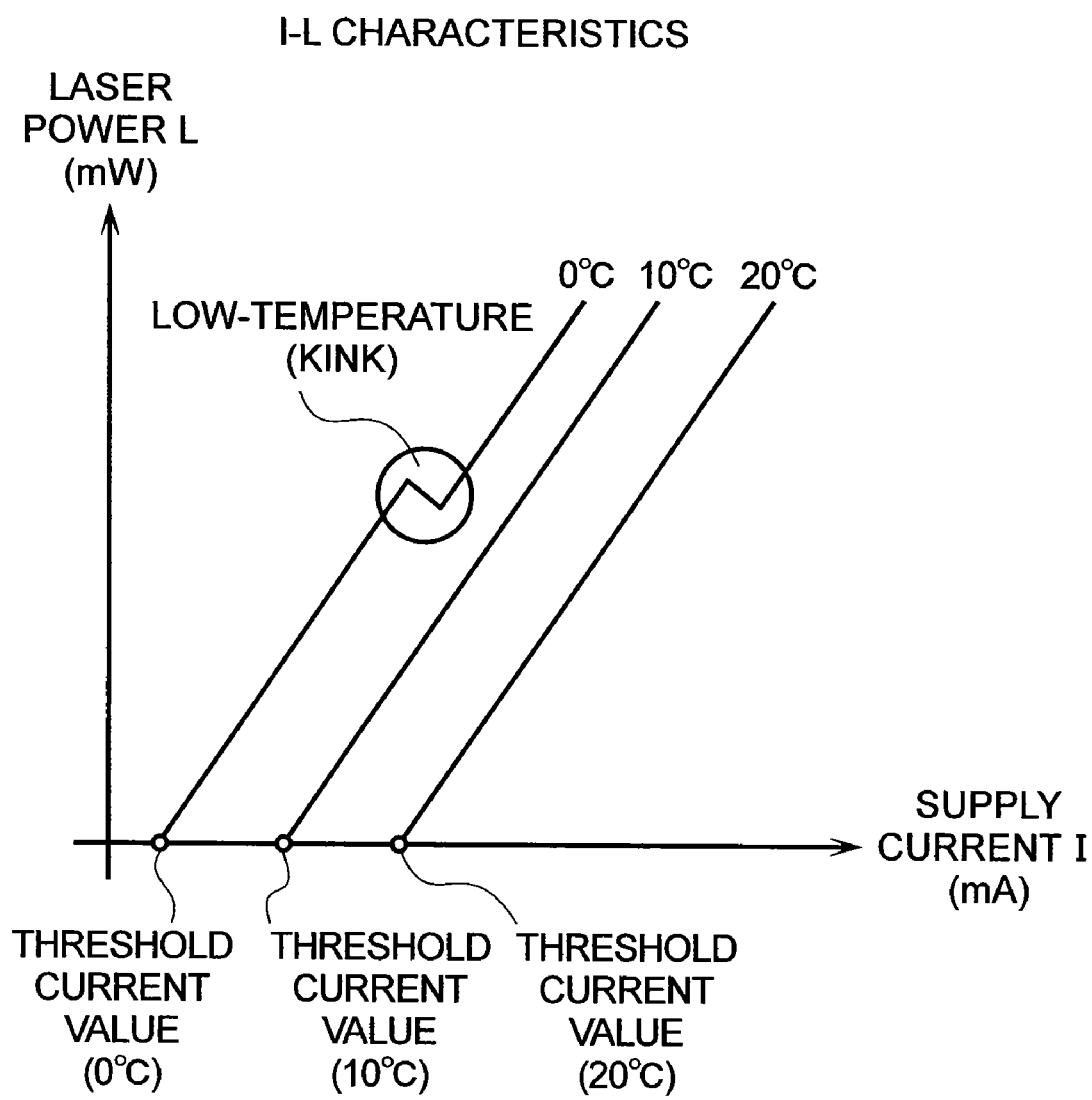
FIG. 2 illustrates one example of I-L characteristics with LD temperature as a parameter.

In other words, FIG. 12 graphically shows that each laser diode in FIG. 1 has its own I-L characteristics different from the others. As depicted in FIG. 12, laser diodes LD1, LD2, and LD3 show different I-L characteristics from each other. Also, these characteristics change as the years go by.

Therefore, at the time of shipment or adjustment at a factory, initial I-L characteristics of each laser diode are first measured at every predetermined temperature and at every predetermined sampling (at every predetermined current value) to collect data, and the data is stored in a memory that is built in a camcorder or an optical disc device, or in a memory that is accessible to either one in form of a table or a equation. Moreover, laser power or intensity of a laser beam is measured and detected with a photodiode or the like as shown in the schematic block diagram of FIG. 3 for example. Hence, the preserved data makes it possible to carry out a series of operations of the present invention.

As to the changes over a period of years, the control microcomputer 19 measures a current value outputting a maximum power rate being set and a threshold current value Ith based on temperature of a laser diode provided by the temperature sensor when a camcorder or an optical disc is running, and substitutes the preserved data with the measured data for shift. Even though temperature setting is not mentioned here, the laser diode may be preheated up to a predetermined temperature range as in embodiments of the present invention.

According to the laser diode control method and device and the camcorder of the embodiments described above, initial current-laser power characteristics of individual laser diode are acquired before shipping at a factory, with a predetermined temperature as a parameter, and the characteristics are stored in a memory of a camcorder or the like. Further, threshold current values at different temperatures are stored, and the laser diode temperature is monitored by the temperature sensor. Therefore, if the laser diode temperature is low, the user may issue a command to set the low-temperature standby mode. In such case, a current equal to or below the threshold value at a given temperature is applied to the laser diode. During the current supply, the laser diode temperature detected by the temperature sensor is continuously monitored such that the laser diode is controlled to be supplied with a threshold current value corresponding to its present temperature.

Preferably, a threshold current value increases in accompany with an increase in temperature.

Moreover, a current value outputting a predetermined maximum power and a threshold value change over a period of years. When training mode is selected (or when power is inputted), the initial state characteristics are shifted to new ones under control.

That is to say, according to the laser diode control method of the above-described embodiments for use in a laser diode control device including a laser diode, a laser diode drive device for driving the laser diode by supplying a current for outputting a laser beam to the laser diode, and a temperature sensor for detecting temperature around the laser diode, if the temperature sensor informs that the laser diode has a temperature equal to or below a predetermined value, the laser diode is fed with a current corresponding to a threshold current value of the laser diode such that a laser beam may be outputted after a preset amount of time is elapsed.

In addition, the laser diode control device of the embodiment described above includes a laser diode, a laser diode drive device for driving the laser diode by supplying a current for outputting a laser beam to the laser diode, a temperature sensor for detecting temperature around the laser diode, a memory for recording a threshold current value of the laser diode, and control means for controlling the drive device to supply a threshold current value corresponding to a detected temperature provided with the temperature sensor to the laser diode and which supplies a current outputting a laser beam to the laser diode after checking that the temperature detected by the temperature sensor reaches an operation guarantee temperature of the laser diode.

Preferably, the control means of the laser diode control device updates a current to be supplied to the laser diode at a predetermined interval, depending on temperature provided by the temperature sensor.

Further, the camcorder of the embodiment described above includes a laser diode and a laser diode drive device for driving the laser diode by supplying the laser diode with a current for outputting a laser beam, and it records/reproduces acquired video data to/from a recording medium under the control of the laser diode control device, in which the camcorder is characterized by including: a temperature sensor for detecting temperature around the laser diode, a memory for recording a threshold current value of the laser diode, and control means for controlling the drive device to supply a threshold current value corresponding to a detected temperature provided with the temperature sensor to the laser diode and supply a current outputting a laser beam to the laser diode after checking that the temperature detected by the temperature sensor reaches an operation guarantee temperature of the laser diode.

Preferably, the control means of the camcorder updates a current to be supplied to the laser diode at a predetermined interval, depending on temperature provided by the temperature sensor.

Therefore, the embodiments having been explained in reference to FIGS. 1 to 12 teach that it is possible to increase temperature of the laser diode up to its operation guarantee temperature by feeding the laser diode with a current that does not output a laser beam. However, although the laser diode temperature may have been increased to the operation guarantee temperature, the temperature rise time until a laser beam is outputted tends to get longer at lower temperatures.

Because of this, if LD temperature is low, it can be an option to execute a writing or reading operation anyway despite that a target laser power level required for the writing or reading operation is not yet reached.

Suppose that, in order to secure a good writing quality, the operation guarantee temperature of a laser diode mounted at a laser diode device ranges from 0 to 40[° C.], and device rise time at 0° C. for the laser diode temperature is 3 [nS]. For instance, if writing onto the optical disc device needs to be done when the laser temperature is at 0[° C.], the writing operation has to be performed when the laser diode is not yet ready (i.e., its illumination state is not sufficient). In such case, because laser power outputted from the laser beam does not have a sufficient energy for executing the writing operation, deterioration in writing quality, e.g., a blur or spreading phenomenon could possibly occur. A blur or spreading phenomenon is a write state (write defect) where a two-value data is not certain between "0" and "1".

Thus, as the device rise time gets longer, the possibility of causing deterioration in writing quality or reading errors (misreading) occurs with high probability.

In another embodiment of the present invention, a current above a threshold current value is supplied to the laser diode in order to raise the laser diode temperature within a shorter period of time. When the laser diode is fed with a current above a threshold current value, a laser beam is outputted. However, if the laser diode temperature is within the operation guarantee range and if temperature is so low that the rise time impedes the writing and reading operations of an optical disc device, the output laser beam in these cases do not have sufficient energy, so it is highly possible to have a poor recording quality, e.g., a blur or spreading phenomenon write, etc.

Therefore, if the laser diode temperature is within the operation guarantee range and if temperature is so low that the rise time impedes the writing and reading operations of an optical disc device, another embodiment of the present invention suggests that a current having a value high enough to output a laser beam, i.e. a current above a threshold current, should be applied to the laser diode to increase its temperature rapidly. As soon as the temperature is increased quickly to a level where the rise time does not impede the writing and reading operations of an optical disc device, a writing (recording) operation or a reading (playback) operation is then executed.

Although a laser beam to be outputted may be radiated before a writing operation or a reading operation starts, a laser beam radiating position is shifted to a region outside a recording region (writing region or reading region) of an optical disc such that the laser beam may be outputted without influencing the optical disc.

In addition, the position of an objective lens (distance from the recording side of an optical disc) is controlled such that a laser beam being outputted before a writing operation or a reading operation starts is not focused on the recording layer in the recording region.

To be short, even if a laser beam may be radiated, it is controlled not to influence an optical disc. In result, a sufficiently large current for outputting a laser beam is supplied to a laser diode, and temperature of the laser diode is raised quickly up to a level where the rise time of the laser diode does not impede a writing operation or a reading operation of the optical disc, so as to execute normal writing (recording) and reading (playback) operations. As a result, the laser diode of present invention can prevent the poor writing (recording) quality and perform a normal writing (recoding) quality, i.e., an appropriate recording quality (writing quality right).

Figure 13:
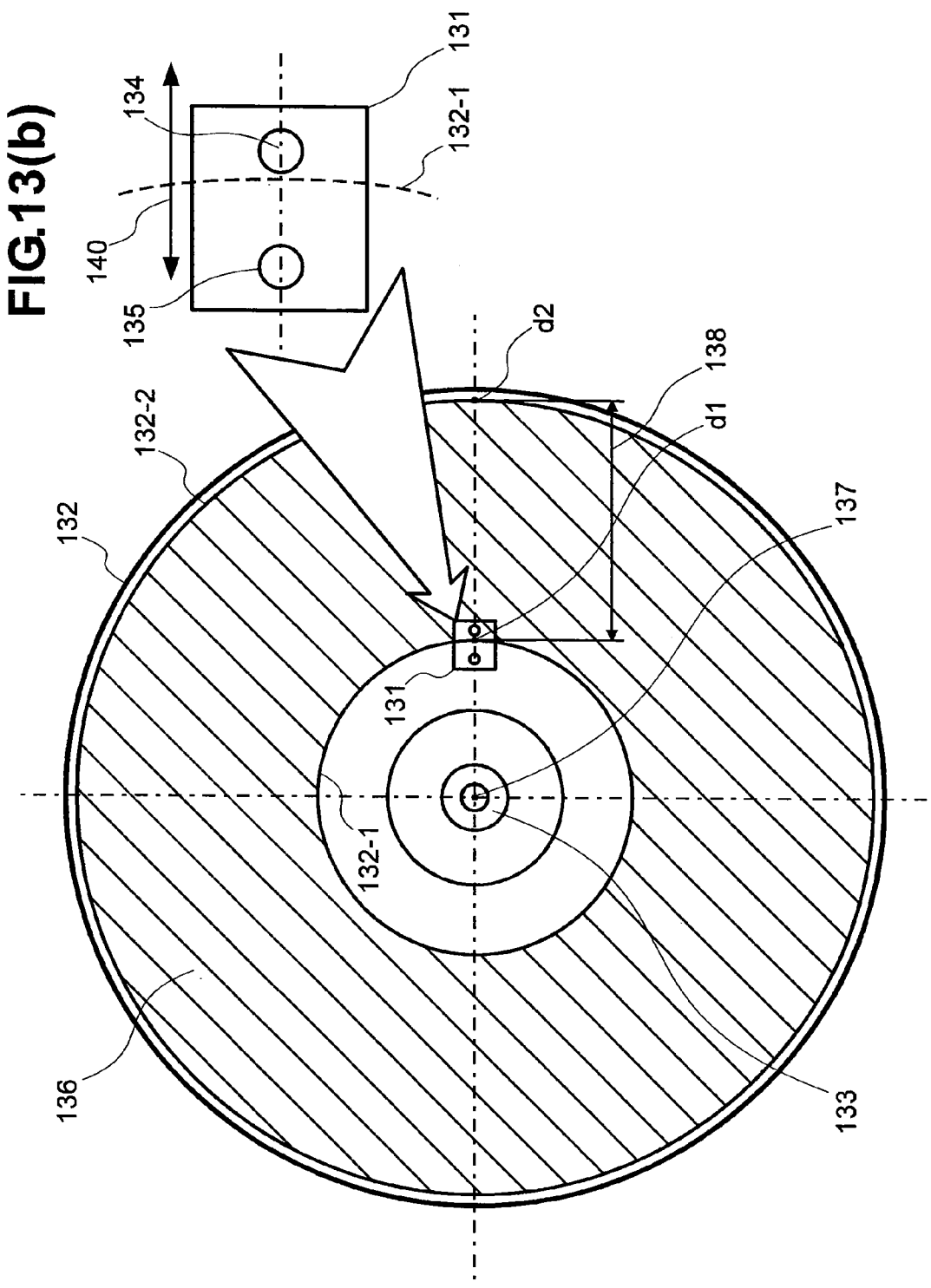
FIGS. 13A and 13B are diagrams for explaining the relationship between optical head position and optical disc position.
Figure 14:
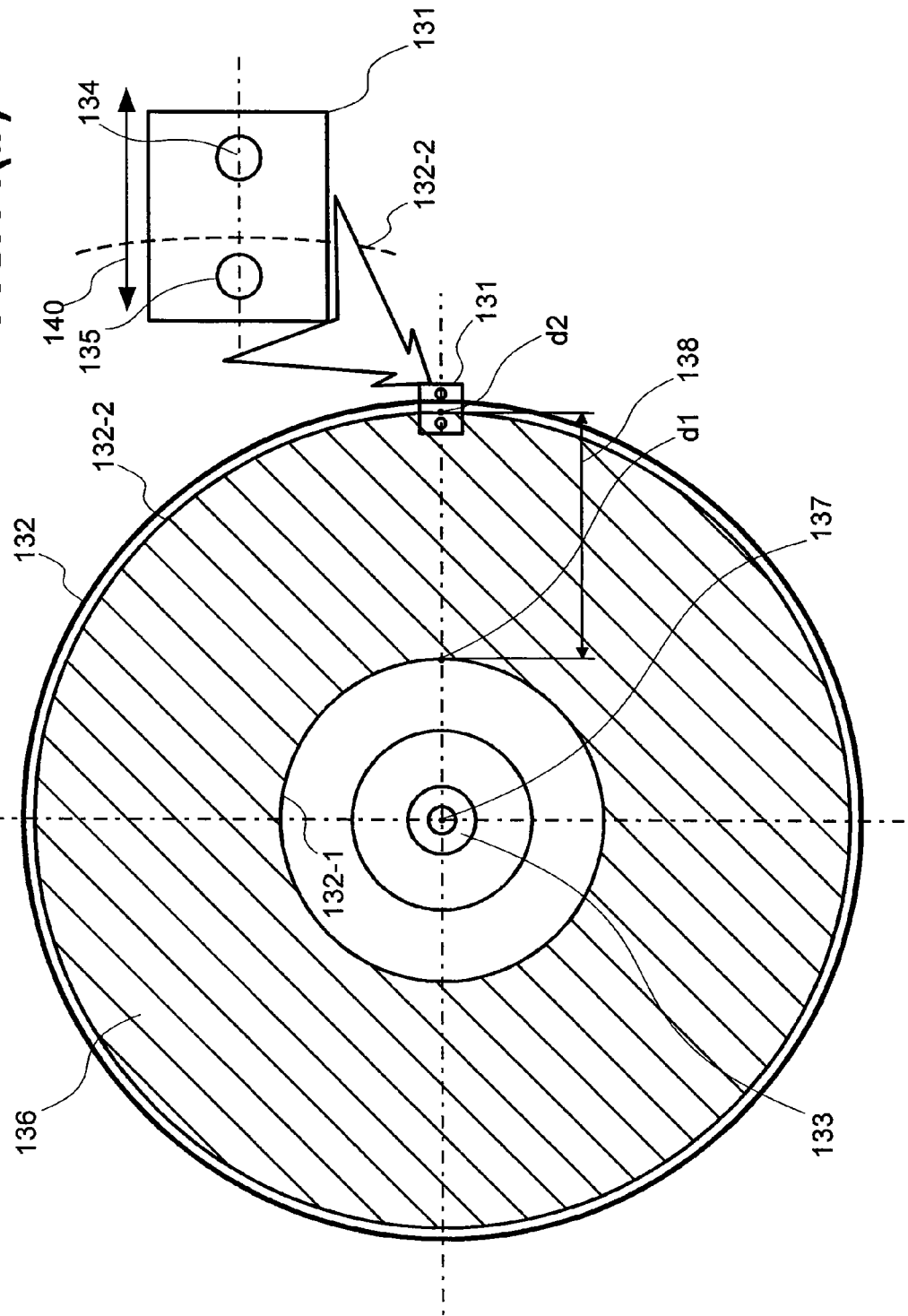
FIGS. 14A and 14B are diagrams for explaining the relationship between optical head position and optical disc position.

The following will describe yet another embodiment of the present invention with reference to FIG. 13, FIG. 14, and FIG. 3. FIGS. 13 and 14 are schematic views of the optical head 1, the optical disc 2, and the spindle motor 22 of FIG. 3. FIGS. 13A and 14A are overall view of them, and FIGS. 13B and 14B are enlarged partial views of a pickup 131, respectively.

At present, the mainstream optical disc drive such as a Blu-ray disc (BD) drive is a 2-lens system. This system uses two (one pair) objective lenses with different focal lengths for an optical pickup head. For instance, they are used exchangeably for DVDs and BDs (JP-A 11-296880, and FIGS. 4 and 5).

In FIGS. 13A 13B 14A and 14B, 131 is a pickup (optical head), 132 is an optical disc, 133 is a spindle motor, 134 is one of two objective lenses of the pickup 131 located on the right side, 135 is one of two objective lenses of the pickup 131 located on the left side, 136 (an area with slashed lines) is a recording region (writing region and reading region) of the optical disc 2, 137 is a rotation center of the optical disc 2 and the spindle motor 133, 138 is an arrow indicating a movement direction and movement range of a seek motor, 132-1 is an innermost recording line on the recording region 136, 132-2 is an outermost recording line on the recording region 136, and 140 is a movement direction of a tracking actuator (tracking ACT).

Referring further to FIG. 13, the recording region 136 is a back side of the optical disc 132. The optical disc 132 is a circular shaped recording medium. Also, the pickup 131 radiates a laser beam from a lower part of the optical disc 132 to a preset location on the recording region 136 through the right hand side lens 134 or the left hand side lens 135.

In FIGS. 13A and 13B, the optical disc 132 rotates engagedly with the spindle motor 133 with respect to the rotation center 137. The pickup 131 moves between point d1 and point d2 along a direction indicated by the arrow 138 (i.e. it moves by the seek motor (shown in FIG. 3) in the lateral direction on a dotted line passing through the rotation center 137).

The right hand side lens 134 and the left hand side lens 135 of the pickup 131 are arranged in parallel with the movement direction 138 of the pickup 131, and they are always located at the dotted line passing through the rotation center 137 even if the pickup 131 driven by the seek motor moves in a radius direction of the optical disc 132.

In FIGS. 13A and 13B, the pickup 131 is positioned at the innermost point (point d1) by the movement of the seek motor, and the left hand side lens 135 is positioned inwardly from the innermost line 132-1. Therefore, in this case, although the left hand side lens 135 of the pickup 131 may transmit a laser beam, the laser beam is not radiated onto the recording region 136 of the optical disc 132.

Next, in FIGS. 14A and 14B, the pickup 131 is positioned at the outermost point (point d2) by the movement of the seek motor, and the right hand side lens 134 is positioned outwardly from the outermost line 132-2. Therefore, in this case, although the right hand side lens 135 of the pickup 131 may transmit a laser beam, the laser beam is not radiated onto the recording region 136 of the optical disc 132.

Figure 15:
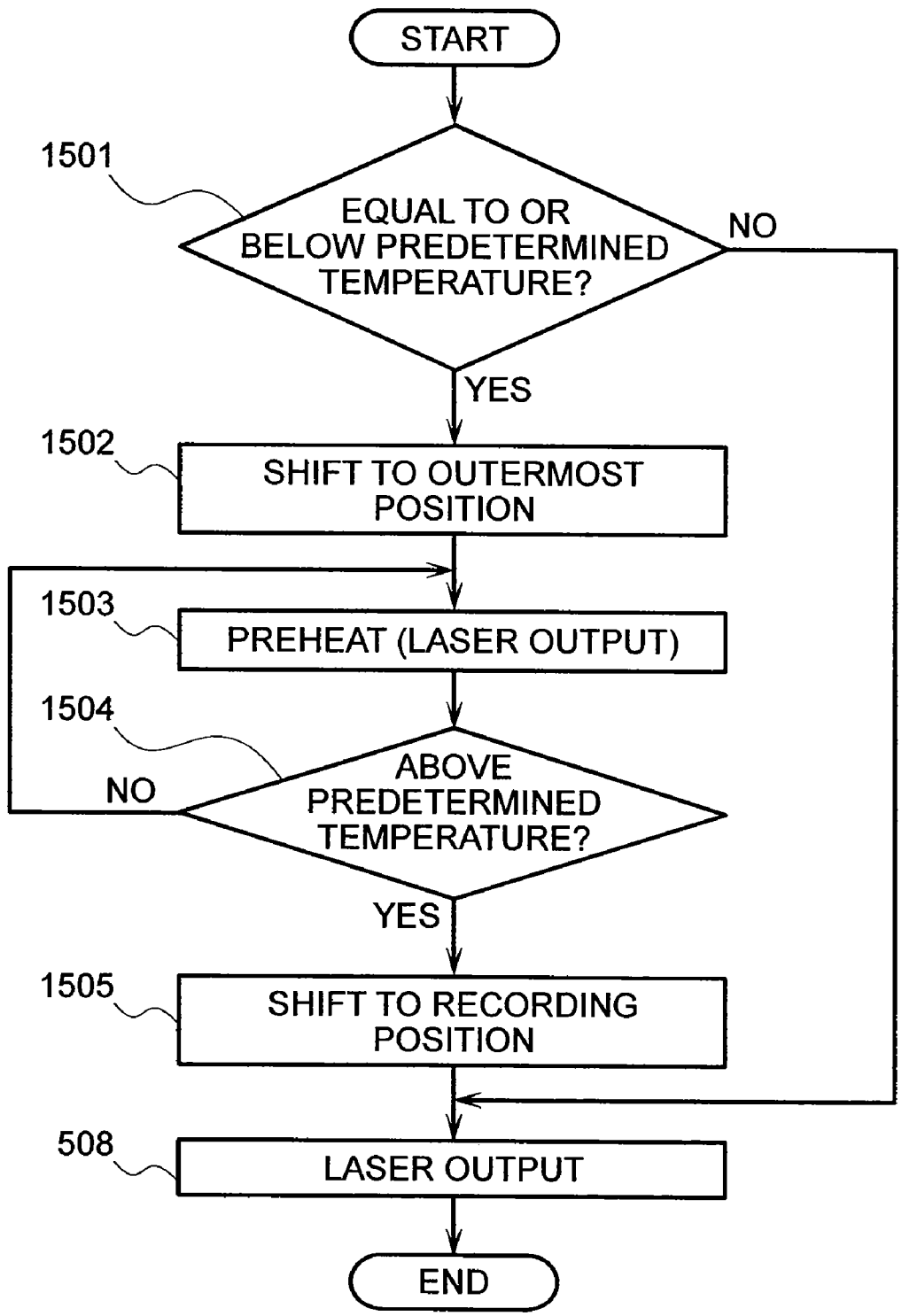
FIG. 15 is a flow chart to explain the operation procedure according to one embodiment of the present invention.

The embodiment described with reference to FIGS. 14A and 14B and FIG. 3 will be explained further with reference to FIG. 15. FIG. 15 is a flow chart for explaining a sequence of operations according to one embodiment of the present invention.

In FIG. 15, when a user uses an interface such as a button and commands writing (recording) or reading (playback) to or from a camcorder or an optical disc, the control microcomputer starts the operation after step S1501.

In step S1501, the control microcomputer 19 decides whether temperature of the laser diode 3 detected by the temperature sensor 4 is equal to or below the predetermined temperature. If the temperature of the laser diode 3 is equal to or below the predetermined temperature, the control microcomputer proceeds to step S1502; otherwise, it proceeds to step S508.

In step S508, a normal operation that involves outputting a laser beam is carried out. That is to say, the camcorder executes writing (recording) or reading (playback) a photographed image onto or from a disc, which is set to the optical disc device, and ends the operation after the writing (recording) or reading (playback) operation is performed.

In step S1502, the motor amp 21 outputs a seek control signal to the seek motor 24, in response to a command from the control microcomputer 19 being transmitted through the DVD signal processor 16, and the pickup 131 moves through the seek motor 24 to a position where the right hand side lens 134 runs away outwardly from the outermost recording line 132-2 of the optical disc 132.

In step 1503, a current above a threshold current value Ith at the current temperature is supplied to the laser diode 3. For example, the control microcomputer 19 obtains the threshold current value at the current temperature from I-L characteristic data (shown in FIG. 1 or FIG. 2, et al.), and sets the supply current to a threshold current value+5 (i.e. Ith+5 [mA]). And the control microcomputer 19 irradiates the laser diode 3 through the right hand side lens 134. In other words, the analog front end 20 supplies a current value which the control microcomputer 19 has commanded to the laser diode 3 (the laser diode 3 will be preheated).

In step S1504, the control microcomputer 19 decides whether temperature of the laser diode 3 is above the measured value (e.g., the lowest value+10° C. of the operation guarantee temperature). If no, it goes back to step S1503 to continue preheating; otherwise, it stops the current supply and proceeds to step S1505.

In step S1505, the motor amp 21 outputs the seek control signal to the seek motor 24, and the seek motor 24 moves the right hand side lens 134 of the pickup 131 to a preset recording region. As such, when a laser beam is radiated onto the optical disc (optical disc 2), the pickup 131 moves to a position where a writing operation or a reading operation is enable, and the control microcomputer 19 proceeds to step S508.

Although this embodiment has set the supply current value for outputting a laser beam to the threshold current value+5 (i.e. Ith+5[mA]), any value above the threshold current value is acceptable, and even a maximum current can be supplied as well.

FIGS. 13A to 15 are used to explain the embodiment for outputting a laser beam by shifting the laser beam radiating position outside the range of the recording region of an optical disc.

As one example, the step S1502 of FIG. 15 suggested that a pick should be moved to the outermost circumference, but the present invention is not limited thereto. For example, considering an amount of time required for moving the pick, the pick may go to a position close to either one of the outermost/innermost circumference according to the (current) pick position to perform step S1502, thereby reducing the processing time. Because control operations vary depending on the arrangement of objective lenses for BD or CD/DVD, any one of the outermost/innermost circumference is an acceptable position for the pick.

Referring to FIG. 16 and FIG. 3, the following will now explain an embodiment for deviation of a focus position under laser radiation. In detail, the position of objective lens of the optical head (pickup) (distance from the recording side of an optical disc) is controlled to prevent a laser beam being outputted from being focused on a recording layer (the recording layer position) of the recording region (writing region or reading region) of the optical disc before a writing operation or a reading operation starts.

Figure 16A:
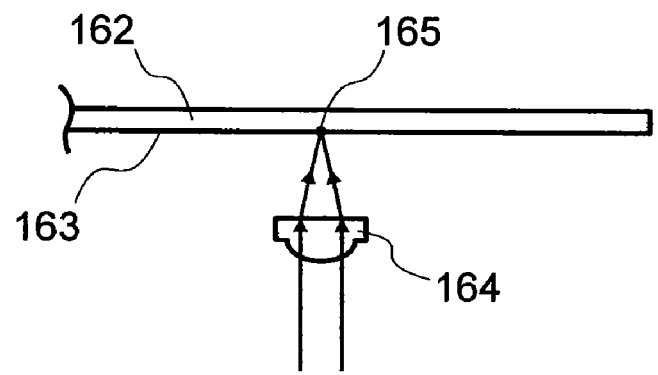
FIGS. 16A to 16C are diagrams for explaining how to deviate a laser beam focus position from a recording layer of an optical disc.
Figure 16B:
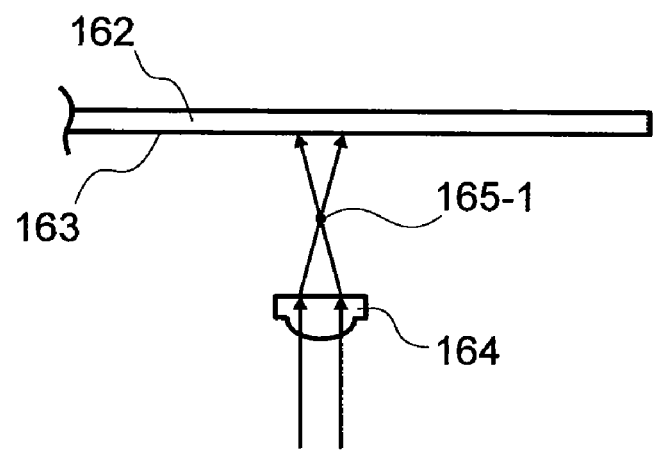
Figure 16C:
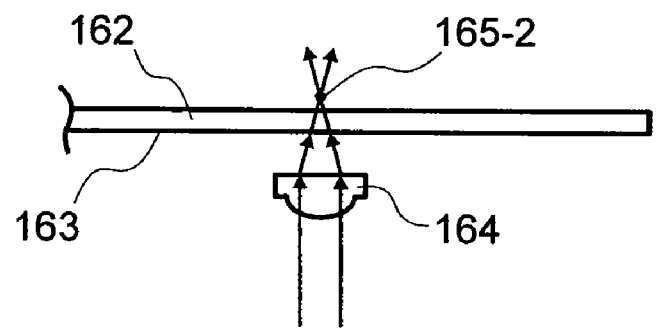

FIGS. 16A to 16C are diagrams for explaining how to deviate a laser beam focus position from a recording layer of an optical disc. In FIG. 16, 162 is a part of an optical disc, 163 is an optical disc, 162 is a recording layer, 164 is an objective lens, and 165, 165-1, and 165-2 are focus positions. Arrows indicate travel directions of laser beams.

FIG. 16A shows that a focus position 165 is right on the recording layer 163 of the optical disc 162, FIG. 16B shows that a focus position 165-1 is in front of the recording layer 163 of the optical disc 162, and FIG. 16C shows that a focus position 165-2 is behind the recording layer 163 of the optical disc 162.

As the focus position is deviated from the position of the recording layer 163 of the optical disc 162 as shown in FIG. 16B and FIG. 16C with the help of the focus actuator (shown in FIG. 3), even if a laser beam may be radiated to the recording layer 163 of the optical disc 162, laser power per unit area is too weak to perform a writing operation or a reading operation. To this end, a laser beam is outputted to raise temperature of the laser diode quickly and shorten the rise time of the laser diode. Once the laser diode temperature is increased to a target level, writing or reading information to or from the recording layer 163 of the optical disc 162 can be done, regardless of the rise time.

Instead of the focus actuator, a tilt actuator (not shown) may also be employed to change the travel direction of a laser beam to a biased direction (changing an angle), and therefore to deviate the focus position from the writing or reading side of the optical disc. Further, both sides of the focus actuator or the tilt actuator can be used to change the focus position from the writing or reading side of the optical disc.

Figure 17:
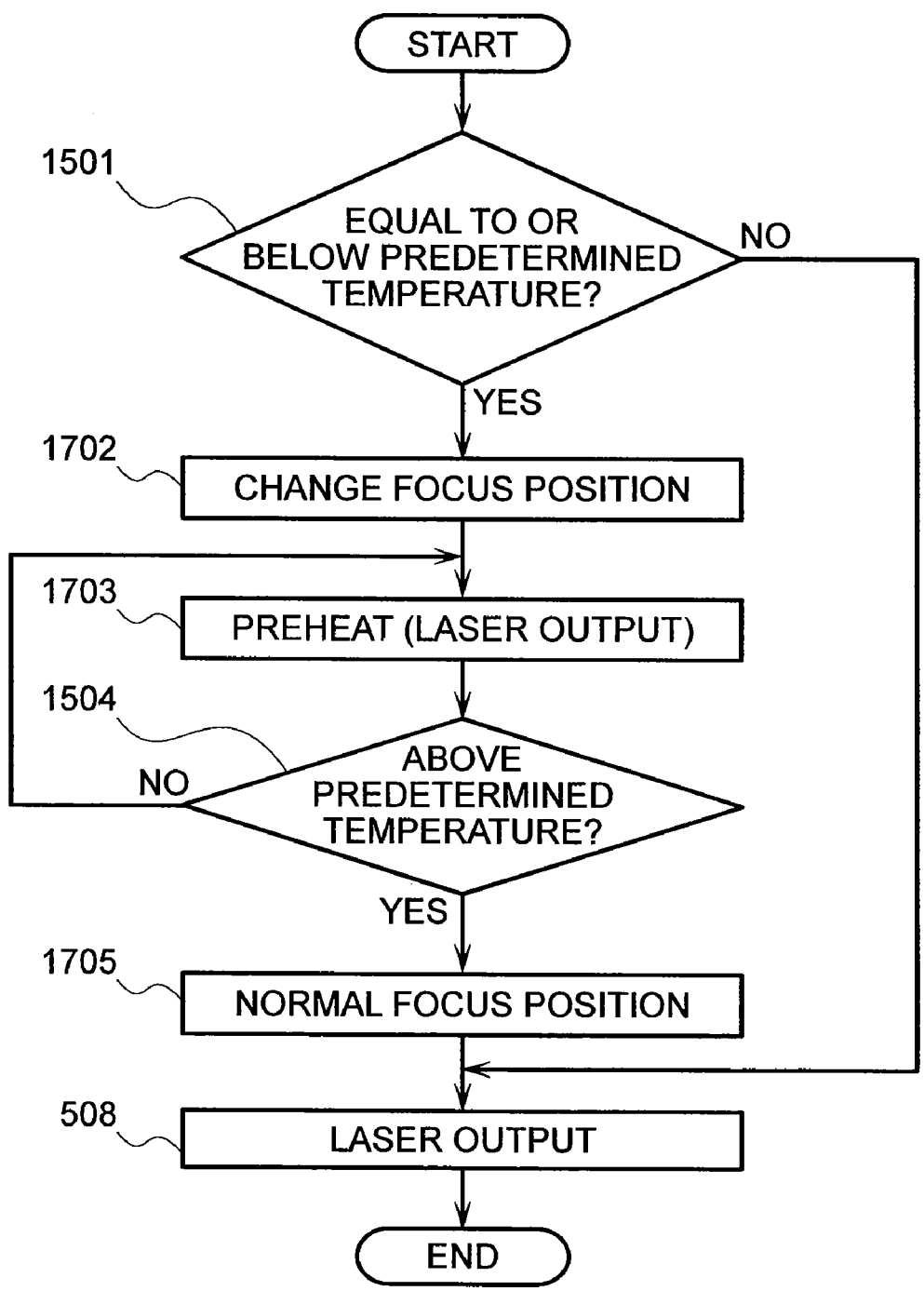
FIG. 17 is a flow chart to explain the operation procedure according to one embodiment of the present invention.

The embodiment described with reference to FIGS. 16A to 16C and FIG. 3 will be explained further with reference to FIG. 17. FIG. 17 is a flow chart for explaining a sequence of operations according to one embodiment of the present invention. Operations with the same step numbers in the flow charts of FIG. 17 and FIG. 15 are identical with each other, so descriptions on them will be omitted. However, a sequence from previous steps (the step S1501 and the step S1504) of the step S1702 and the step S1705, and a sequence to subsequent steps (the step S1703 and the step S508) will be explained.

Referring to FIG. 17, in step S1702, the motor amp 21 outputs a focus control signal (shown in FIG. 3) to the focus actuator 8, in response to a command from the control microcomputer 19 being transmitted through the DVD signal processor 16. The focus position of the laser beam is then changed through the focus actuator 8 to the position 165-1 in front of the recording layer 163 of the optical disc, and the control microcomputer 19 proceeds to step S1703.

In step S1703, similar to the step S1503 (shown in FIG. 15), a current above a threshold current value Ith at the current temperature is supplied to the laser diode.

Next, when temperature of the laser diode exceeds a preset temperature in step S1504, the control microcomputer 19 proceeds to step S1705.

In step S1705, the motor amp 21 outputs a focus control signal (shown in FIG. 3) to the focus actuator 8, in response to a command from the control microcomputer 19 being transmitted through the DVD signal processor 16. The focus position of the laser beam is then changed through the focus actuator 8 to the normal position, i.e. the position 165 on the recording layer 163 of the optical disc, and the control microcomputer 19 proceeds to step S508. When the focus position is at the normal position (the position 165 on the recording layer 163) under laser radiation, the recording layer 163 of the optical disc may be influenced by the laser beam, so it is good to stop the laser radiation before the step S1705 is carried out.

Thereafter, a normal operation that involves outputting a laser beam is carried out. Namely, the camcorder executes writing (recording) or reading (playback) a photographed image onto or from a disc, which is set to the optical disc device, and ends the operation after the writing (recording) or reading (playback) operation is performed.

The embodiment of FIGS. 13A to 15 suggests that if temperature of the laser diode is equal to or below a predetermined temperature, the pickup need to be moved to the innermost position or to the outermost position. Since a current cannot be supplied to the laser diode until the movement of the pickup is completed, time is wasted to a certain extent.

In addition, the embodiment of FIGS. 16A to 17 suggests that it take time for the focus actuator to deviate the focus position from the recording layer 163 (i.e. setting the focus point to any different positions other than the recording layer of a recording medium) and to restore (i.e. setting the focus point to the recording layer position of a recording medium). Moreover, although laser power per unit area is low, a laser beam is radiated onto the recording layer 163, possibly resulting in deterioration of the recording layer 163.

Figure 18:
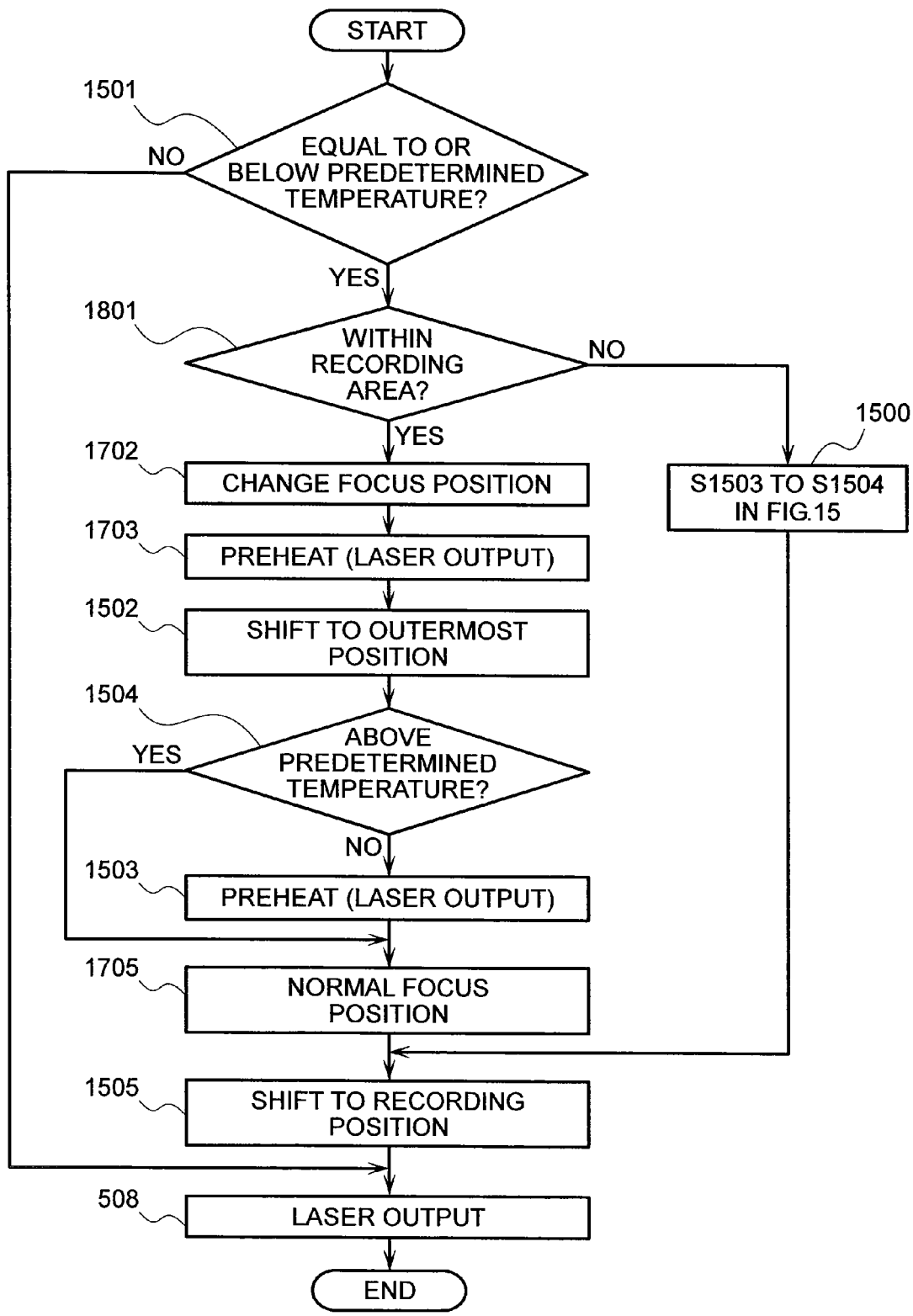
FIG. 18 is a flow chart to explain the operation procedure according to one embodiment of the present invention.

Therefore, the embodiment of FIGS. 13A to 15 and the embodiment of FIGS. 16A to 17 are combined to get another embodiment in FIG. 18. FIG. 18 is a flow chart for explaining a sequence of operations according to one embodiment of the present invention.

In this embodiment of FIG. 18, a laser beam is outputted such that the focus position is not at the recording layer 163 while the pickup is moving (i.e. with respect to a vertical direction, the focus position is set to any different positions other than the recording layer), and the pickup ends its movement. After the pickup moves to the innermost position or to the outermost position with respect to a horizontal direction (the step S1502 of FIG. 18 assumes that the pickup moves to the outermost position), the focus position returns to its former position (i.e. setting the focus position to a position on an extended line from the recording layer of a recording medium) and the laser is outputted. That is to say, the pickup moves outside the recording area in the horizontal direction, and the focus position is shifted to the recording layer position of a recording medium. Thus, the pickup is located at a position on the extended line from the recording layer of a recording medium.

As a result, time loss in the movement of the pickup and deterioration of the recording layer 163 can be minimized.

Operations with the same step numbers in the flow charts of FIG. 18 and FIG. 15 are identical with each other, so descriptions on them will be omitted. However, a different sequence of the operations for individual steps will be explained.

Referring to FIG. 18, when a user uses an interface such as a button and commands writing (recording) or reading (playback) to or from a camcorder or an optical disc, the control microcomputer starts the operation after step S1501.

Operations in step S1501 and step S508 have already been explained before. In this embodiment, however, when temperature of the laser diode 3 is equal to or below a predetermined temperature in step S1501, the control microcomputer 19 proceeds to step S1801.

In step S1801, the control microcomputer 19 checks the position of an objective lens of a laser diode to be used to decide whether the objective lens is located within the recording (writing) region or the playback (reading) region of an optical disc. If the position of a corresponding object lens is located within the recording (writing) region or the playback (reading) region of an optical disc, the control microcomputer 19 proceeds to step S1702; otherwise, it proceeds to step S1500.

In step S1500, the step S1503 of FIG. 15 is carried out. Again, if temperature of the laser diode exceeds a predetermined temperature in step S1504, the control microcomputer 19 proceeds to step S1505 in FIG. 18; otherwise, it proceeds to step S1503 in FIG. 15.

After the focus position is deviated from the recording layer 163 in step S1702 (i.e. with respect to a vertical direction, the focus position is set to any different positions other than the recording layer), the control microcomputer 19 proceeds to step S1703. Similar to the embodiment of FIG. 17, a current above a threshold current value is supplied to the laser diode, and the laser diode is preheated under laser radiation.

Next, in step S1502, the objective lens in a preheated state is moved to the outermost position or the innermost position. The step S1502 in FIG. 18 shows a case where the objective lens is moved to the outermost position for example. If temperature of the laser diode is over a predetermined value in step S1504, the control microcomputer 19 proceeds to step S1705; otherwise, it proceeds to step S1503 to continue preheating as in the embodiment of FIG. 15.

Similar to the embodiment of FIG. 17, in step S1705, the focus position of the laser beam is changed to a normal position, that is, a position on the extended line of the recording layer 163 of an optical disc, and the microcomputer 19 proceeds to step S1505. If the focus position is at the normal position under laser radiation, the recording layer 163 of an optical disc may be influenced by the laser beam, so it is good to stop the laser radiation before the step S1705 is carried out.

Similar to the embodiment of FIG. 15, in step S1505, the set position of a pickup objective lens is changed by the seek motor to a predetermined recording region. In result, the pickup moves to a position where a writing operation or a reading operation is possible under laser radiation, and the control microcomputer 19 proceeds to step S508.

As such, according to the embodiment of FIG. 18, even though the laser diode temperature is within the operation guarantee temperature range, if the rise time is longer than the time required for a writing or reading operation of an optical disc device, the laser diode temperature is increased quickly such it becomes possible to shorten the rise time than the time required for a writing or reading operation of an optical disc device.

In the embodiment of FIG. 18, when the pickup is being moved by the focus actuator, a laser beam is outputted in a way that it is not focused on the recording layer 163 and the pickup ends moving. After the pickup moves to the outermost position or the innermost position with respect to the horizontal direction (the step S1502 of FIG. 18 assumes that the pickup moves to the outermost position), the focus position returns to its former position by the focus actuator and the laser is outputted. Technically speaking, the movement of the pickup in a horizontal direction by the seek motor is not good if the pickup ends up with regions other than the recording region of an optical disc. Preferably, the pickup is moved by a predetermined distance away from the boundary of the recording area. Moreover, a laser beam should not be outputted until after the pickup moves to the recording position by the focus actuator.

The reason will now be explained using FIG. 24. FIG. 24 is a diagram for explaining a relationship between the recording layer of an optical disc and the focus position of the laser beam.

Figure 24A:
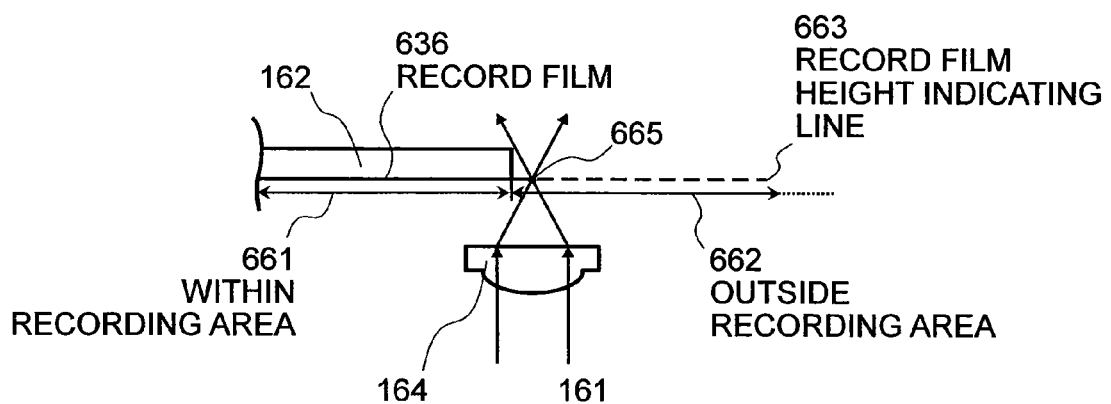
FIGS. 24A and 24B are diagrams for explaining a relationship between a recording layer of an optical disc and a focus position of a laser beam.
Figure 24B:
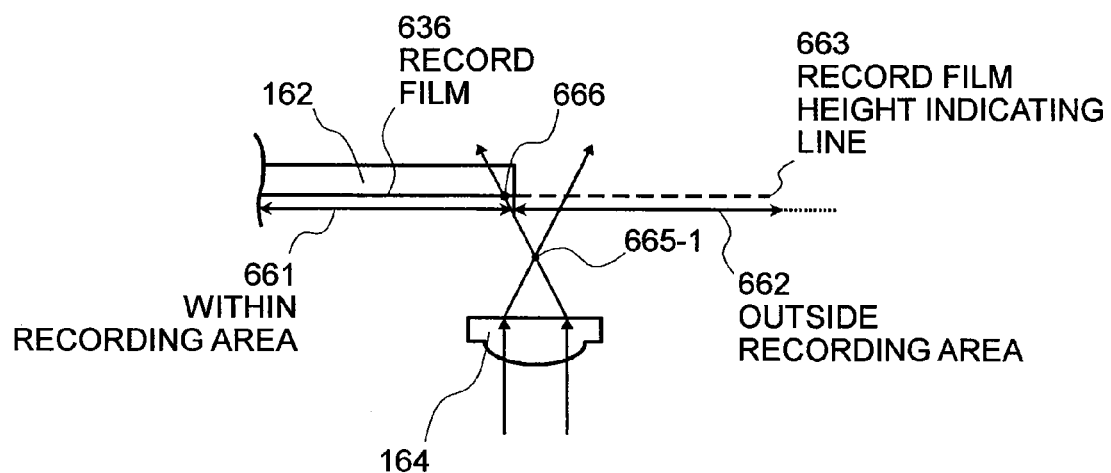

FIG. 24A shows that the pickup is at a proper position outputting a laser beam in both horizontal and vertical directions. FIG. 24B shows that the pickup has ended its movement in the horizontal direction (it is at a proper position), but not in the vertical direction. In the drawing, 162 is a part of an optical disc, 635 is an optical disc 162, 164 is an objective lens, 665 and 665-1 are focus positions, 661 is an arrow indicating the range of a horizontal direction within a recording region, 662 is an arrow indicating the range of a horizontal direction outside the recording region, 663 is a line indicating the height of the recording layer, and 666 is a spot on the recording layer 636 to which a laser beam is radiated. In FIG. 18, the region that has been described as the extended line of the recording layer corresponds to a region 662 in the horizontal direction, which is outside the recording region and to part of the line 663 indicating the height of the recording layer in the vertical direction. Although not shown in FIG. 24, other regions besides the recording region are found inside and outside the recording region 636 of an optical disc. Moreover, the arrow indicates graphically a travel direction of a laser beam.

In FIG. 24A, the focus position 665 of the pickup is found in the region 662 outside the recording region in the horizontal direction, and in the recording layer 636 in the vertical direction (with respect to the focus point). In this case, as indicated with an arrow, a laser beam is not radiated to the recording layer 636, having no influence thereon.

In FIG. 24B, however, the focus position 665-1 of the pickup is found in the region 662 outside the recording region in the horizontal direction and in the region outside the recording region 636 in the vertical direction (with respect to the focus point) as well. In this case, as indicated with an arrow, a laser beam may sometimes be radiated to the recording region 636 (the radiating spot 666). Because of this, the recording layer 636 could possibly be damaged. Therefore, it is better not to radiate (output) laser diode until after the pickup focus position is shifted to the line 663 indicating the height of the recording layer.

This also explains why the vertical direction position of the pickup should remain apart from the inside 661 of the recording region by a preset distance even though the vertical direction position of the pickup may be suitable (it is located on the line indicating the height of the recording layer). Therefore, the innermost recording line and the outermost recording line in the present invention are carefully selected positions by offsetting a distance separated inwardly or outwardly from the focus point and the angle of a laser beam coming from an objective lens by a predetermined value.

Figure 19:
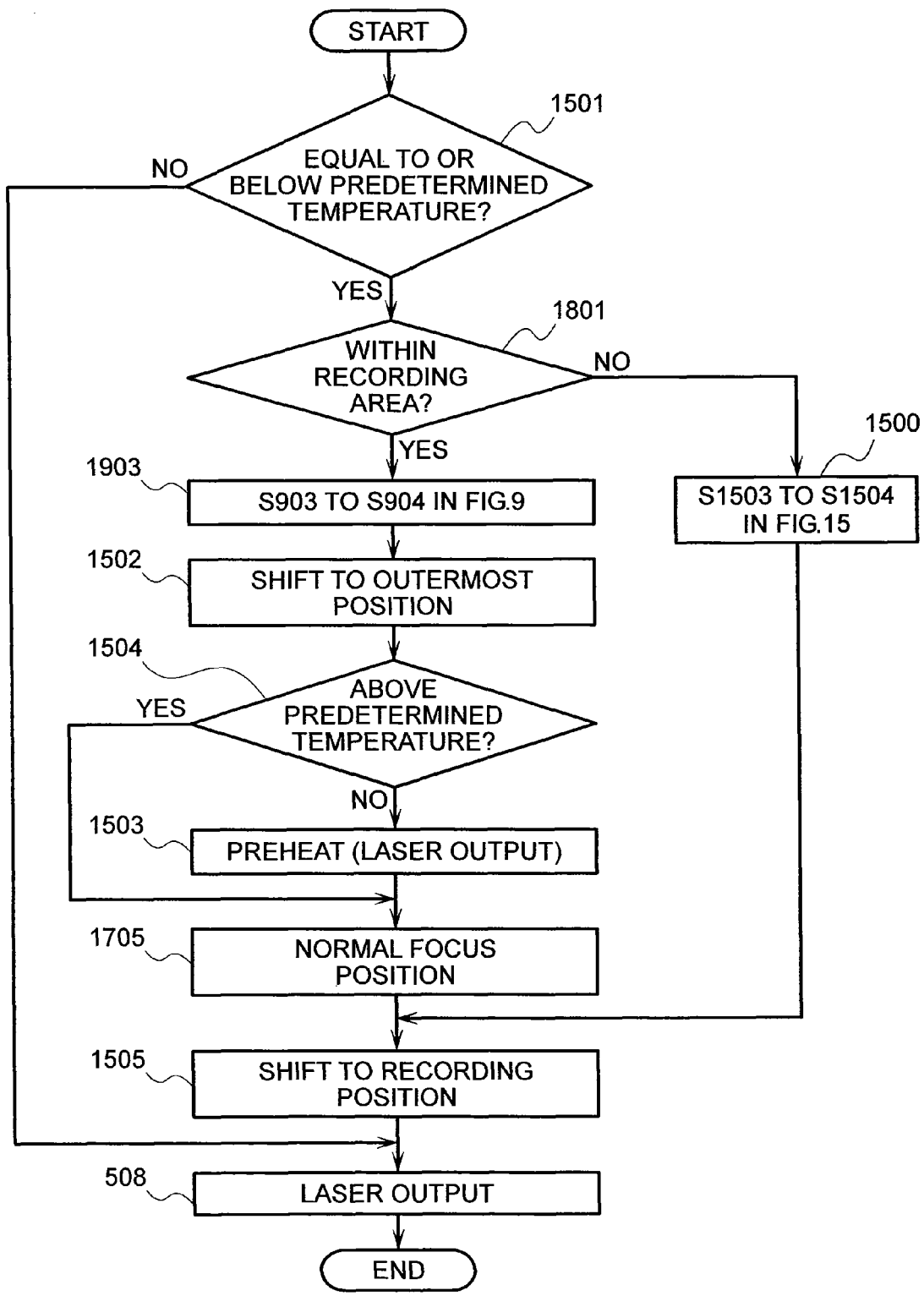
FIG. 19 is a flow chart to explain the operation procedure according to one embodiment of the present invention.

The embodiment of FIGS. 13A to 15 and the embodiment of FIGS. 16A, 16B and 17 are combined to get yet another embodiment in FIG. 19. FIG. 19 is a flow chart for explaining a sequence of operations according to one embodiment of the present invention.

According to the embodiment of FIG. 19, when the pickup is moving within the recording region, a current equal to or below the threshold current value is supplied to the laser diode to heat the laser diode to a level where no laser beam is outputted, and the pickup ends its movement. Then a laser beam is emitted after the pickup moves to a region except the recording region at the outermost or innermost position. In this way, the time loss in movement of the pickup and the time loss in changing or switching the focal length can be eliminated.

Operations with the same step numbers in the flow charts of FIG. 19 and FIG. 18 are identical with each other, so descriptions on them will be omitted. However, a different sequence of the operations for individual steps will be explained.

The embodiment of FIG. 19 differs from the embodiment of FIG. 18 in that the steps S1702 and S1703 are replaced by the steps S903 and S904 discussed earlier in FIG. 9.

In step S1801, the control microcomputer 19 decides whether the position of an objective lens, i.e. the pickup, of a laser diode to be used is within the recording region range. If yes, the control microcomputer 19 proceeds to step S903 of FIG. 9; otherwise, it proceeds to step S1500.

Since operations in the steps S903 and S904 have already been explained, descriptions on them will be omitted.

In step S904, however, the control microcomputer 19 proceeds to step S1502 while continuing the preheating operation, and applies a current equal to or below the threshold current value continuously to the laser diode to keep it warm until the pickup moves to a region except the recording region.

Now that the threshold current value changes into temperature (heat) of the laser diode, the control microcomputer 19 checked, in the step S501 of FIG. 9, the temperature of the diode as it increases, while changing the threshold current value. However, this operation is not performed in the embodiment of FIG. 19 since it is time until the pickup moves to a region except the recording region that is taken account.

In the embodiment of FIGS. 13A to 14B, two objective lenses of the optical pickup were arranged in the radius direction (the movement direction of the pickup) of an optical disc. However, it is obvious that the objective lenses may also be arranged at right angles to the radius direction (the movement direction of the pickup) of an optical disc, or arranged in a manner that they move to a region except the recording region of an optical disc.

Besides, the number of objective lenses installed in the pickup is not necessarily limited to two, but can be 1 or a plural number according to application.

Figure 20:
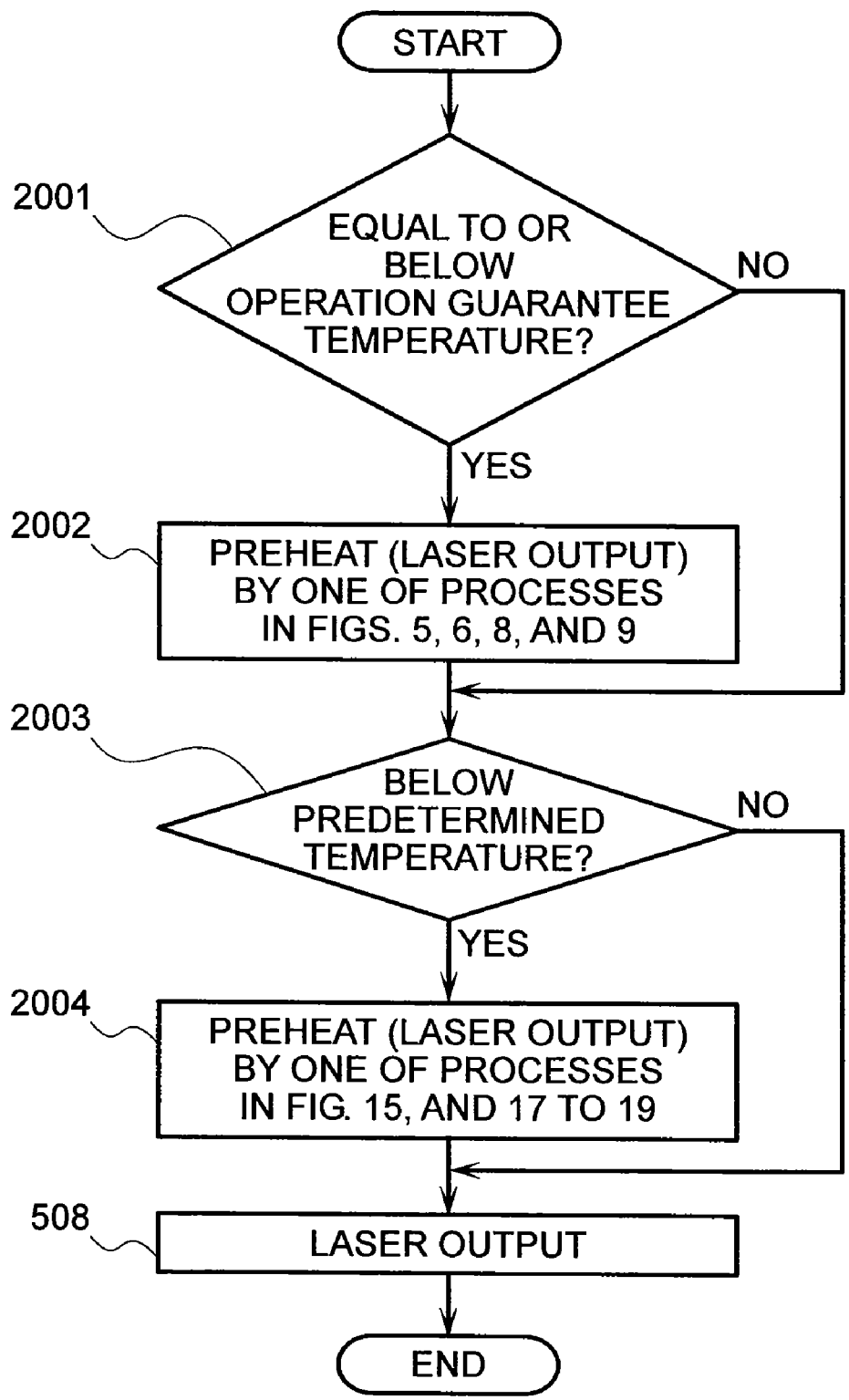
FIG. 20 is a flow chart to explain the operation procedure according to one embodiment of the present invention.

The embodiments of FIGS. 1 to 12 and the embodiments of FIGS. 13A to 19 are combined to introduce yet another embodiment (a series of operations) described in a flow chart of FIG. 20.

As described in FIG. 20, if a user tries to use a device like an optical disc device or a camcorder loaded with such optical disc device at a low temperature outside the operation guarantee temperature of a laser diode, the embodiments of FIGS. 1 to 12 is first applied.

In step S2001, the step S501 in the flow chart of FIG. 5, FIG. 6, FIG. 8 or FIG. 9 is carried out. That is, the control microcomputer 19 decides whether the laser diode temperature is equal to or below the operation guarantee temperature. If yes, it proceeds to step S2002; otherwise, it proceeds to step S2003.

In step S2002, the control microcomputer 19 carries out all operations in steps from S501 to S508 of FIG. 5, FIG. 6, FIG. 8 or FIG. 9 are carried out, and proceeds to step S2003.

Therefore, by supplying a current equal to or below the threshold current value to the laser diode to keep it warm in absence of laser radiation, temperature of the laser diode can be increased to the operation guarantee temperature range.

Next, the embodiments of FIGS. 13A to 19 are applied.

Referring to FIG. 20, in step S2003, the operation in step S1501 in FIG. 15, FIG. 17, FIG. 18 or FIG. 19 is carried out. In short, the control microcomputer 19 decides whether the laser diode temperature is equal to or below a predetermined temperature. If yes, it proceeds to step S2004; otherwise, it proceeds to step S508.

In step S2004, the control microcomputer 19 carries out all operations in steps from S1501 to S508 of FIG. 15, FIG. 17, FIG. 18 or FIG. 19 are carried out, and proceeds to step S508.

In step S508, a normal operation that involves outputting a laser beam is carried out. That is to say, the camcorder executes writing or reading a photographed image onto or from a disc, which is set to the optical disc device, and ends the operation after the writing (recording) or reading (playback) operation is performed.

Thus, a current above the threshold current value that enables the output of a laser beam is applied to the laser diode, and the laser diode is outputted to the reading region while a writing operation or a reading operation is not yet possible. To this end, temperature of the laser diode is raised again until the laser diode reaches a temperature level where its rise time does not impair the writing and reading quality of a device like an optical disc device or a camcorder loaded with such optical disc device, and a writing (recording) operation or a reading (playback) operation is then executed.

In the embodiment of FIG. 19, temperature of the laser diode is detected in the step S1501, and the control microcomputer 19 decides if the temperature is equal to or below a predetermined temperature to proceed to a subsequent process. The embodiments after FIG. 13 have set a condition that the predetermined temperature is included in the operation guarantee temperature of the laser diode, and the operations performed when the pickup is located within the recording region are mainly considered.

Modifying the embodiment of FIG. 19, however, the step S1501 of FIG. 19 suggests that if the predetermined temperature is set to the operation guarantee temperature and if the pickup is located within the recording region, the laser diode is preheated in absence of laser radiation until the pickup moves to a region except the recording region. Later, if temperature of the laser diode exceeds the operation guarantee temperature, the laser diode is heated continuously until it reaches a temperature level where the writing or reading condition is not impeded by the rise time. Then the writing or reading operation may start by moving the pickup to a predetermined position within the recording region.

In the embodiments of FIGS. 1 to 20, writing (recording) information onto an optical disc was performed after the laser diode is heated to a predetermined temperature. However, in some cases, one may miss a shooting chance or a recording chance if the recording operation is not done readily. Thus, an embodiment set forth below enables an optical disc device used for an information recording/playback apparatus such as a camcorder to do recording onto an optical disc thereof, without missing a shooting chance or a recording chance.

Figure 21:
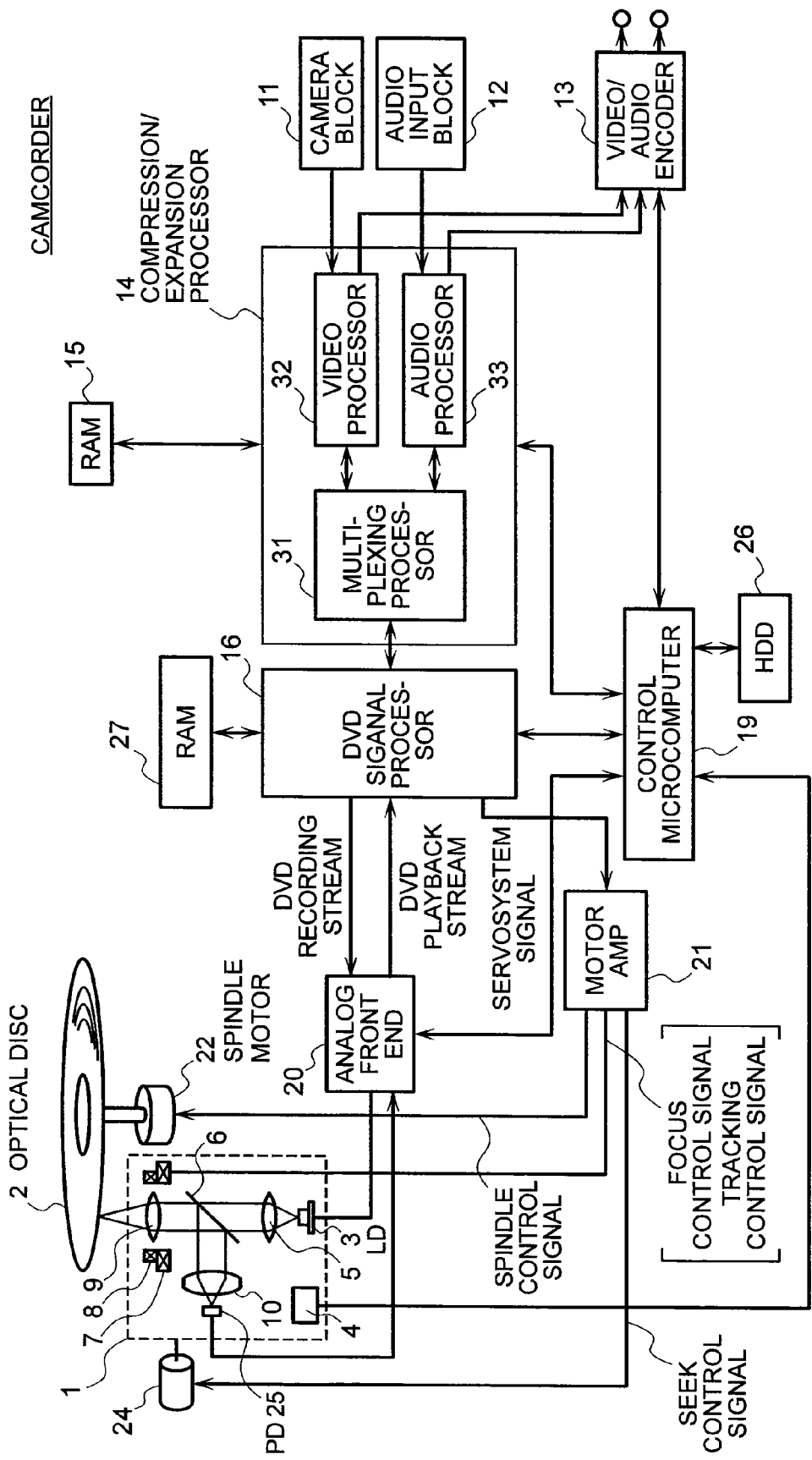
FIG. 21 is a block diagram illustrating the schematic configuration of a camcorder according to one embodiment of the present invention.

FIG. 21 is a block diagram illustrating the schematic configuration of a camcorder according to one embodiment of the present invention. Like reference numerals are given to like elements that are used for the camcorder of the embodiment in FIG. 3, and descriptions on them are therefore omitted. In the drawing, reference numeral 26 is a hard disc device, and reference numeral 27 is a RAM.

In FIG. 21, the hard disc device 26 is connected to a control microcomputer 19 by ATAPI (AT Attachment Packet Interface). The RAM 27 includes a playback RAM 17 and a recording RAM 18 of FIG. 3.

Figure 22:
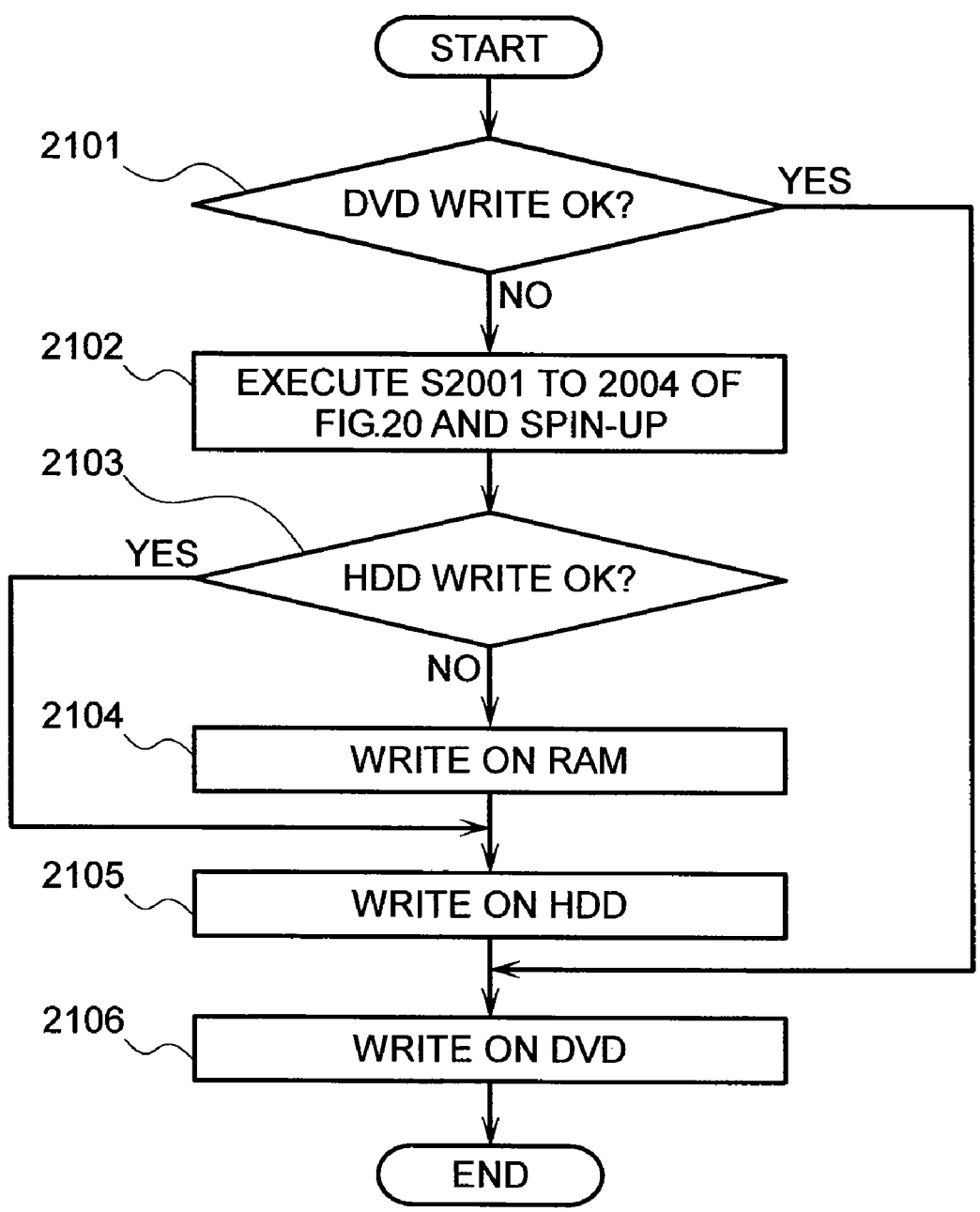
FIG. 22 is a flow chart to explain the operation procedure according to one embodiment of the present invention.

Operations of the camcorder shown in FIG. 21 will now be explained with reference to a flow chart of FIG. 22. FIG. 22 is a flow chart for explaining a sequence of operations according to one embodiment of the present invention.

For subsequent operations, the control microcomputer 19 accesses all necessary components inside the camcorder according to an operational program of the camcorder (e.g., taking information and executing a control).

Referring to FIG. 22, when a user uses an interface such as a button and commands writing (recording) or reading (playback) to or from a camcorder or an optical disc, the operation after step S2101 starts.

In step S2101, the control microcomputer 19 obtains a detected temperature of a laser diode to decide whether a writing operation can be done onto an optical disc readily. If writing is possible, the control microcomputer 19 proceeds to step S2106; otherwise, it proceeds to step S2102.

In step S2102, the control microcomputer 19 decides which embodiment out of FIGS. 1 to 12, or FIGS. 13A to 18, or FIGS. 19 to 20 should be applied, under a current laser diode temperature, and starts the operations from one of them (this embodiment executes the steps S2001 to S2004 of FIG. 20). At the same time, HDD spinup is initiated to make the HDD enable for writing. Then, the control microcomputer 19 proceeds to step S2103.

In step S2103, the control microcomputer 19 decides whether writing onto the HDD is possible (e.g., whether the spinup has ended). If writing is possible, the control microcomputer 19 proceeds to step S2105; otherwise, it proceeds to step S2104.

In step S2104, the control microcomputer 19 stores acquired data in the RAM 27, and proceeds to step S2105. The operation in step S2105 is carried out after a predetermined time has lapsed, or before the recording capacity of the RAM 27 is full.

In step S2105, the control microcomputer 19 stores the data acquired by the RAM 27 and data being inputted subsequently later in the HDD 26, and proceeds to step S2106.

In step S2106, the control microcomputer 19 starts writing the data from the HDD 26 onto an optical disc 2. When all data from the HDD 26 is written to the optical disc, the control microcomputer 19 writes data outputted from the RAM 27 directly to the optical disc.

After that, the control microcomputer 19 executes the remaining operations until a user issues a further command.

In general, the RAM 27 has a sufficient recording capacity to able to store data continuously until the HDD 26 is enabled for a writing operation. Likewise, with the recent technical advance in large-capacity HDDs, the HDD 26 will have no problem with recording, but it is necessary to make sure that the HDD 26 has a sufficient capacity until the optical disc 2 is enabled for a writing operation.

According to the embodiments of FIG. 21 and FIG. 22, although the optical disc is disabled for a writing operation or the writing quality is poor as temperature of a laser diode thereof is low, writing data onto the optical disc can be achieved within a very short period of time. Therefore, that data that the user wants to record is not lost.

The embodiments of FIGS. 20 and 21 used RAM and HDD, but other recording media of different formats can be used as well. For instance, a semiconductor memory can be employed instead of RAM.

Figure 23:
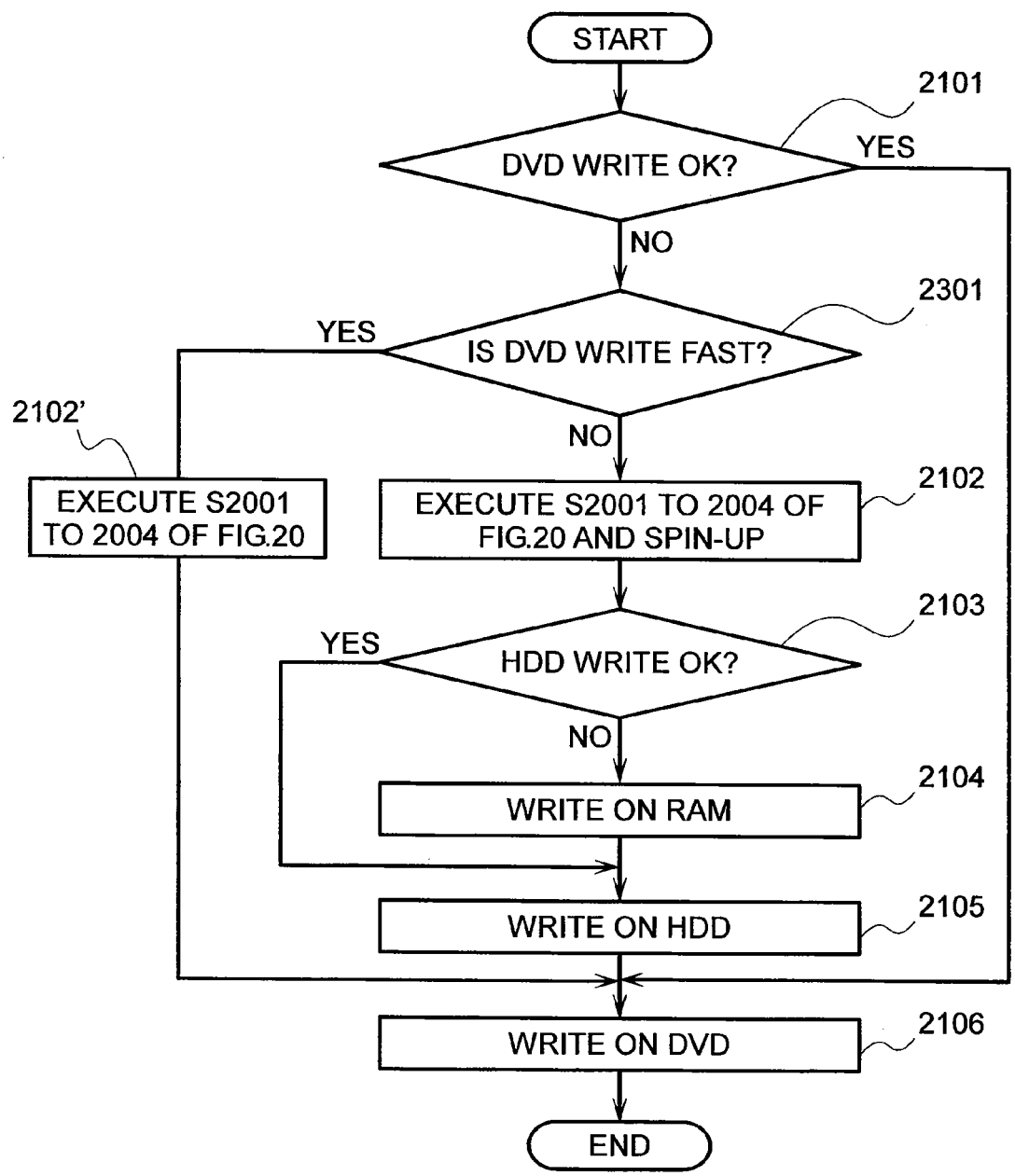
FIG. 23 is a flow chart to explain the operation procedure according to one embodiment of the present invention.

The following will now explain another embodiment related to the operations of the camcorder shown in FIG. 21, referring to FIG. 23. FIG. 23 is a drawing for explaining a sequence of operations according to one embodiment of the present invention. In this embodiment, step S2301 and step S2302 are added, and step S2102' is employed in replacement of the step S2102. In other words, compared with the flow start in FIG. 22, in the flow chart in FIG. 23, there is step S2301 between "NO" branch of step S2101 and step S2102', "NO" branch in step S2301 is connected to step S2102', step S2302 is added to "YES" branch of step S2301, and the operation in step S2302 is connected to step S2106. Descriptions on those steps being already discussed earlier with reference to FIG. 22 will be omitted. However, different sequences of operations in individual steps will be explained.

Referring to FIG. 23, in step S2102, the control microcomputer 19 obtains a detected temperature of the laser diode, and proceeds to step S2301 if immediate writing onto the optical disc is not possible.

In step S2301, the control microcomputer 19 compares an amount of time to enable writing onto the DVD (time for completing the preheating process) with an amount of time to enable writing onto the HDD (time for completing the spinup). If the time to enable writing onto the HDD is shorter than the time to enable writing onto the DVD, the control microcomputer 19 proceeds to step S2102'. Meanwhile, if the time to enable writing onto the DVD is shorter than the time to enable writing onto the HDD, the control microcomputer 19 proceeds to step S2302.

In step S2301, the control microcomputer 19 calculates an amount of time to enable writing onto the DVD for example according to a predetermined process, i.e. the embodiment of FIG. 15, under a current laser diode temperature, and compares the calculated time with the amount of time to enable writing onto the HDD. And if the time to enable writing onto the HDD is shorter, the control microcomputer 19 proceeds to step S2102'. However, if the time to enable writing onto the DVD is shorter, the control microcomputer 19 proceeds to step S2302.

In step S2102', the control microcomputer 19 performs the operations in steps S1502 to S1505 of FIG. 15 on the optical head 1, starts the spinup of the HDD 26, and proceeds to step S2103.

In step S2302, the control microcomputer 19 performs the operations in steps S1502 to S1505 of FIG. 15 on the optical head 1, and proceeds to step S2106.

Moreover, data like the calculation of an amount of time to enable writing of the optical head 1 or an amount of time to enable writing onto the HDD is preserved in a memory (not shown) built in the control microcomputer 19 for example, such that the control microcomputer 19 can withdraw the data, and contents of the data are also updated according to needs. Instead of calculating the time to enable writing, a table or a data table preserved in the memory may be referred as well.

The embodiment of FIG. 23 has controlled the time to write onto the DVD by the embodiment of FIG. 15, but it is obvious that the present invention is not limited to the control method.

In step S2301, one of embodiments of the present invention may be used to calculate the shorted time and determine whether writing is enabled with such a short period of time, and an operation to enable writing within the most shortest amount of time is selected and applied.

According to the embodiment of FIG. 23, the control microcomputer 10 compares (1) the time for completing the preheating process of the laser diode with (2) the time taken to complete the HDD spinup. If (1) is shorter or if (1) and (2) are equal, the control microcomputer 19 does not start the HDD spinup but carries out preheating of the laser diode. Meanwhile, if (2) is shorter, the control microcomputer 19 starts the preheating and the spinup simultaneously, and recording onto the HDD is then handed over recording onto the optical disc when preheating of the laser diode is completed while recording is being performed on the HDD. Therefore, by changing a recording place after taking into account the amount of time taken to enable writing, it becomes possible to record the user data quickly. Because a proper control to stop the HDD spinup is done after taking account of processing time, the number of HDD spinup is decreased and power consumption can be reduced, thereby making the present invention advantageous for portable electronic appliance using a battery.

The embodiment described above has explained a camcorder combined with an optical disc device. However, the present invention is not limited to it and can be applicable to a separate video camera (including a digital camera) and an optical disc device only. Further, the optical disc device of the present invention is not limited to a camera such as a camcorder and can be applied to an electronic machine loaded with an information recording device, information playback device, or information recording/playback device.

For instance, the optical disc device can be incorporated into personal digital assistant (PDA), cellular phone, etc.

The present invention relates to a laser diode used for writing or reading data to or from a recording medium of an optical disc device. It is not necessarily to use a CD, DVD, next-generation DVD, etc., using a laser beam to apply the present invention to both sides of writing (recording) and reading (playback) operations. It is enough that the present invention is applied to at least one of writing and reading. For instance, even when the present invention is applied to writing only, a magneto-optic type recording medium using magnetism for a reading operation, e.g., magneto-optical disc (Mo) or mini disc (MD), may be used as well. Therefore, as MD has been mentioned, any recording purposes or objects can be acceptable.

In addition, it is obvious that the present invention is not limited to the optical disc device used in a camcorder and can be applied to an information recording/playback device using the optical disc device or any recorder units enabling a writing operation.

This embodiment used a circular optical disc as a recording medium. However, this is for embodiments only and the shape of an optical disc applied to the present invention is not limited to a circular shape.

Moreover, the present invention is not limited to a laser diode only and can be applied to LEDs with the same properties. For example, it can be used advantageously for signal lights, outdoor lamps, advertisement displays such as electric signs, traffic signs, TV sets and so on.

Even though the temperature sensor detected temperature directly, the controller like the control microcomputer may detect data in a separate physical unit like thermocouple and convert it to temperature. Also, the table or the equation does not have to be expressed in terms of temperature but as data in physical unit that the temperature sensor detects.

According to the embodiments explained so far, even at a low temperature outside the operation guarantee temperature range incapable of outputting a laser beam, a current equal to or below the threshold current value may be impressed to the laser diode to increase its temperature. In so doing, the laser diode temperature gets into the operation guarantee temperature range and starts outputting a laser beam, such that a normal writing or reading operation can be performed.

According to the present invention, when an information recording/playback device such as a camcorder is used outdoors where a surrounding temperature is so low that a low-temperature kink phenomenon could possibly occur, the laser diode control method and device and the information recording/playback device of the present invention make it possible to execute normal recording/playback of information.

While the present invention has been described with respect to the specific embodiments, it will be apparent to those skilled in the art that various changes and modifications may be made without departing from the spirit and scope of the invention as defined in the following claims.

What is claimed is:

1. A laser diode control method used for a laser diode control device comprising:
    a laser diode;
    a drive device for supplying a current to the laser diode to drive the same;
    a pickup having the laser diode, an objective lens, objective lens moving means for changing a focus position of the objective lens, and a case for accommodating the elements;
    pickup moving means for moving the pickup to a predetermined radiating position;
    a temperature sensor for detecting temperature around the laser diode;
    a semiconductor memory and/or a hard disc device, and
    a controller,
    wherein, if temperature detected by the temperature sensor is equal to or below a predetermined value and if a pickup radiating position is located within a recording region on a recording medium, the controller controls the objective lens moving means to set a focus position of a laser beam being radiated to the recording medium to a position outside a recording layer of the recording medium; the controller controls the pickup moving means to move the pickup outside the recording region of the recording medium; and the controller controls the drive device to supply a current exceeding a threshold value to the laser diode, thereby outputting a laser beam,
    wherein, if the pickup is moved to a position outside the recording region of the recording medium, the controller controls the objective lens moving means to set a focus position of a laser beam being radiated to the recording medium to a position on an extension line of a recording layer of the recording medium, and the controller controls the drive device to supply a current exceeding a threshold value to the laser diode, thereby outputting a laser beam,
    wherein, if temperature detected by the temperature sensor is equal to or below a predetermined value, the laser diode control device does not record audio and/or video onto the recording medium, but records audio and/or video onto the semiconductor memory and/or the hard disc device.

2. A laser diode control method used for a laser diode control device comprising:
    a laser diode;
    a drive device for supplying a current to the laser diode to drive the same;

a pickup having the laser diode, an objective lens, objective lens moving means for changing a focus position of the objective lens, and a case for accommodating the elements;

pickup moving means for moving the pickup to a predetermined radiating position;

a temperature sensor for detecting temperature around the laser diode;

a semiconductor memory and/or a hard disc device, and a controller, wherein, if temperature detected by the temperature sensor is equal to or below a predetermined value and if a pickup radiating position is located within a recording region on a recording medium, the controller controls the pickup moving means to move the pickup outside the recording region of the recording medium; and the controller controls the drive device to supply a current equal to or below a threshold value to the laser diode, thereby outputting no laser beam, wherein, if the pickup is moved to a position outside the recording region of the recording medium, the controller controls the objective lens moving means to set a focus position of a laser beam being radiated to the recording medium to a position on an extension line of a recording layer of the recording medium, and the controller controls the drive device to supply a current exceeding a threshold value to the laser diode, thereby outputting a laser beam, wherein, if temperature detected by the temperature sensor is equal to or below a predetermined value, the laser diode control device does not record audio and/or video onto the recording medium, but records audio and/or video onto the semiconductor memory and/or the hard disc device.

3. An information recording/playback device including an optical disc device for recording or playing back, under control of a laser diode control device, at least one of video and audio onto or from a recording medium, the device comprising:

a laser diode;

a drive device for supplying a current to the laser diode to drive the same;

a pickup having the laser diode, an objective lens, objective lens moving means for changing a focus position of the objective lens, and a case for accommodating the elements;

pickup moving means for moving the pickup to a predetermined radiating position;

a temperature sensor for detecting temperature around the laser diode;

a semiconductor memory and/or a hard disc device, and a controller, wherein, under control of the controller, the laser diode control device controls the pickup moving means to move the pickup outside a recording region of a recording medium if temperature detected by the temperature sensor is equal to or below a predetermined value, the laser diode control device controls the drive device to supply a current exceeding a threshold value to the laser diode, the laser diode control device controls the pickup moving means to move the pickup to a predetermined recording position of the recording medium if temperature detected by the temperature sensor exceeds a predetermined value, and the laser diode control device records data to or reads data from the recording medium, wherein, if temperature detected by the temperature sensor is equal to or below a predetermined value, the laser diode control device compares spinup time of the hard disc device with preheating time of the laser diode, if the spinup time of the hard disc device is shorter than the preheating time of the laser diode, the laser diode control device starts spinup of the hard disc device and does not record audio and/or video on the recording medium until preheating processing of the laser diode ends, but records audio and/or video onto the semiconductor memory and/or the hard disc device, if the preheating time of the laser diode is shorter than the spinup time of the hard disc device, the laser diode control device starts the preheating processing on the laser diode but does not perform spinup of the hard disc device, and the laser diode control device records audio and/video on the recording medium after the preheating processing of the laser diode ends.

4. The information recording/playback device according to one of claim 3, wherein, if the pickup is moved to a position outside the recording region of the recording medium, the laser diode control device additionally controls the objective lens moving means to set a focus position of a laser beam being radiated to the recording medium to a position on an extension line of a recording layer of the recording medium, and the laser diode control device controls the drive device to supply a current exceeding a threshold value to the laser diode, thereby outputting a laser beam from the laser diode.

5. The information recording/playback device according to one of claim 4 wherein, if temperature detected by the temperature sensor is equal to or below a predetermined value, the laser diode control device does not record audio and/or video onto the recording medium, but records audio and/or video onto the semiconductor memory and/or the hard disc device.

6. The information recording/playback device according to one of claim 3 wherein, if temperature detected by the temperature sensor is equal to or below a predetermined value, the laser diode control device does not record audio and/or video onto the recording medium, but records audio and/or video onto the semiconductor memory and/or the hard disc device.

7. An information recording/playback device including an optical disc device for recording or playing back, under control of a laser diode control device, at least one of video and audio onto or from a recording medium, the device comprising:

a laser diode;

a drive device for supplying a current to the laser diode to drive the same;

a pickup having the laser diode, an objective lens, objective lens moving means for changing a focus position of the objective lens, and a case for accommodating the elements;

pickup moving means for moving the pickup to a predetermined radiating position;

a temperature sensor for detecting temperature around the laser diode;

a semiconductor memory and/or a hard disc device, and a controller, wherein, under control of the controller, the laser diode control device controls the objective lens moving means to set a focus position of a laser beam being radiated to the recording medium to a position outside a recording layer of the recording medium if temperature detected by the temperature sensor is equal to or below a predetermined value and if a pickup radiating position is located within a recording region on a recording medium, the laser diode control device controls the drive device to supply a current exceeding a threshold value to the laser diode, thereby outputting a laser beam from the laser diode, the laser diode control device controls the pickup moving means to move the pickup to a predetermined recording position of the recording medium if temperature detected by the temperature sensor exceeds a predetermined value, and the laser diode control device records data to or reads data from the recording medium, wherein, if temperature detected by the temperature sensor is equal to or below a predetermined value, the laser diode control device compares spinup time of the hard disc device with preheating time of the laser diode, if the spinup time of the hard disc device is shorter than the preheating time of the laser diode, the laser diode control device starts spinup of the hard disc device and does not record audio and/or video on the recording medium until preheating processing of the laser diode ends, but records audio and/or video onto the semiconductor memory and/or the hard disc device, if the preheating time of the laser diode is shorter than the spinup time of the hard disc device, the laser diode control device starts the preheating processing on the laser diode but does not perform spinup of the hard disc device, and the laser diode control device records audio and/video on the recording medium after the preheating processing of the laser diode ends.

8. The information recording/playback device according to one of claim 7 wherein, if temperature detected by the temperature sensor is equal to or below a predetermined value, the laser diode control device does not record audio and/or video onto the recording medium, but records audio and/or video onto the semiconductor memory and/or the hard disc device.

9. An information recording/playback device including an optical disc device for recording or playing back, under control of a laser diode control device, at least one of video and audio onto or from a recording medium, the device comprising:
  a laser diode;
  a drive device for supplying a current to the laser diode to drive the same;
  a pickup having the laser diode, an objective lens, objective lens moving means for changing a focus position of the objective lens, and a case for accommodating the elements;
  pickup moving means for moving the pickup to a predetermined radiating position;
  a temperature sensor for detecting temperature around the laser diode;
  a semiconductor memory and/or a hard disc device, and
  a controller,
  wherein, under control of the controller, the laser diode control device controls the objective lens moving means to set a focus position of a laser beam being radiated to the recording medium to a position outside a recording layer of the recording medium if temperature detected by the temperature sensor is equal to or below a predetermined value and if a pickup radiating position is located within a recording region on a recording medium, and the laser diode control device controls the drive device to supply a current exceeding a threshold value to the laser diode, thereby outputting a laser beam while controlling the pickup moving means to move the pickup to a position outside a recording region of the recording medium, wherein, if temperature detected by the temperature sensor is equal to or below a predetermined value, the laser diode control device compares spinup time of the hard disc device with preheating time of the laser diode, if the spinup time of the hard disc device is shorter than the preheating time of the laser diode, the laser diode control device starts spinup of the hard disc device and does not record audio and/or video on the recording medium until preheating processing of the laser diode ends, but records audio and/or video onto the semiconductor memory and/or the hard disc device, if the preheating time of the laser diode is shorter than the spinup time of the hard disc device, the laser diode control device starts the preheating processing on the laser diode but does not perform spinup of the hard disc device, and the laser diode control device records audio and/video on the recording medium after the preheating processing of the laser diode ends.

10. The information recording/playback device according to one of claim 9,
  wherein, if the pickup is moved to a position outside the recording region of the recording medium, the laser diode control device additionally controls the objective lens moving means to set a focus position of a laser beam being radiated to the recording medium to a position on an extension line of a recording layer of the recording medium, and
  the laser diode control device controls the drive device to supply a current exceeding a threshold value to the laser diode, thereby outputting a laser beam from the laser diode.

11. The information recording/playback device according to one of claim 10 wherein, if temperature detected by the temperature sensor is equal to or below a predetermined value, the laser diode control device does not record audio and/or video onto the recording medium, but records audio and/or video onto the semiconductor memory and/or the hard disc device.

12. The information recording/playback device according to one of claim 9 wherein, if temperature detected by the temperature sensor is equal to or below a predetermined value, the laser diode control device does not record audio and/or video onto the recording medium, but records audio and/or video onto the semiconductor memory and/or the hard disc device.

13. An information recording/playback device including an optical disc device for recording or playing back, under control of a laser diode control device, at least one of video and audio onto or from a recording medium, the device comprising:
  a laser diode;
  a drive device for supplying a current to the laser diode to drive the same;
  a pickup having the laser diode, an objective lens, objective lens moving means for changing a focus position of the objective lens, and a case for accommodating the elements;
  pickup moving means for moving the pickup to a predetermined radiating position;

a temperature sensor for detecting temperature around the laser diode;

a semiconductor memory and/or a hard disc device, and a controller, wherein, under control of the controller, if temperature detected by the temperature sensor is equal to or below a predetermined value and if a pickup radiating position is located within a recording region on a recording medium, the laser diode control device controls the drive device to supply a current equal to or below a threshold value to the laser diode, thereby not outputting a laser beam while controlling the pickup moving means to move the pickup outside a recording region of the recording medium, wherein, if temperature detected by the temperature sensor is equal to or below a predetermined value, the laser diode control device compares spinup time of the hard disc device with preheating time of the laser diode, if the spinup time of the hard disc device is shorter than the preheating time of the laser diode, the laser diode control device starts spinup of the hard disc device and does not record audio and/or video on the recording medium until preheating processing of the laser diode ends, but records audio and/or video onto the semiconductor memory and/or the hard disc device, if the preheating time of the laser diode is shorter than the spinup time of the hard disc device, the laser diode control device starts the preheating processing on the laser diode but does not perform spinup of the hard disc device, and the laser diode control device records audio and/video on the recording medium after the preheating processing of the laser diode ends.

14. The information recording/playback device according to one of claim 13, wherein, if the pickup is moved to a position outside the recording region of the recording medium, the laser diode control device additionally controls the objective lens moving means to set a focus position of a laser beam being radiated to the recording medium to a position on an extension line of a recording layer of the recording medium, and the laser diode control device controls the drive device to supply a current exceeding a threshold value to the laser diode, thereby outputting a laser beam from the laser diode.

15. The information recording/playback device according to one of claim 14 wherein, if temperature detected by the temperature sensor is equal to or below a predetermined value, the laser diode control device does not record audio and/or video onto the recording medium, but records audio and/or video onto the semiconductor memory and/or the hard disc device.

16. The information recording/playback device according to one of claim 13 wherein, if temperature detected by the temperature sensor is equal to or below a predetermined value, the laser diode control device does not record audio and/or video onto the recording medium, but records audio and/or video onto the semiconductor memory and/or the hard disc device.

* * * * *